United States Patent
Wenxu et al.

(10) Patent No.: US 9,773,802 B2
(45) Date of Patent: Sep. 26, 2017

(54) METHOD OF FABRICATING SYNAPSE MEMORY DEVICE

(71) Applicant: Samsung Electronics Co., Ltd., Suwon-si, Gyeonggi-do (KR)

(72) Inventors: Xianyu Wenxu, Suwon-si (KR); Inkyeong Yoo, Yongin-si (KR); Hojung Kim, Suwon-si (KR); Seong ho Cho, Gwacheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/209,371

(22) Filed: Jul. 13, 2016

(65) Prior Publication Data

US 2017/0084619 A1    Mar. 23, 2017

(30) Foreign Application Priority Data

Sep. 18, 2015 (KR) .................. 10-2015-0132605

(51) Int. Cl.
*H01L 29/792* (2006.01)
*H01L 27/1157* (2017.01)
(Continued)

(52) U.S. Cl.
CPC .......... *H01L 27/1157* (2013.01); *G11C 11/54* (2013.01); *H01L 21/0217* (2013.01); *H01L 21/02175* (2013.01); *H01L 21/02183* (2013.01); *H01L 21/02186* (2013.01); *H01L 21/28282* (2013.01); *H01L 21/308* (2013.01); *H01L 21/76202* (2013.01); *H01L 21/76224* (2013.01); *H01L 29/0649* (2013.01); *H01L 29/0847* (2013.01); *H01L 29/685* (2013.01);
(Continued)

(58) Field of Classification Search
CPC ............. H01L 27/1157; H01L 21/0217; H01L 21/02175; H01L 21/02186; H01L 21/02183; H01L 21/28282; H01L 21/76202; H01L 21/76224; H01L 29/0649; H01L 29/0847; H01L 29/66833
See application file for complete search history.

(56) References Cited

U.S. PATENT DOCUMENTS 6,940,740 B2    9/2005   Ueda et al.
7,978,510 B2    7/2011   Modha et al.
(Continued)

FOREIGN PATENT DOCUMENTS

KR    2010-0007467 A    1/2010
KR    20120136015 A     12/2012
KR    2015-0014577 A    2/2015

*Primary Examiner* — Fei Fei Yeung Lopez
(74) *Attorney, Agent, or Firm* — Harness, Dickey & Pierce P.L.C.

(57) ABSTRACT

Example embodiments relate to a method of fabricating a synapse memory device capable of being driven at a low voltage and realizing a multi-level memory. The synapse memory device includes a two-transistor structure in which a drain region of a first transistor including a memory layer and a first source region of a second transistor share a source-drain shared area. The synapse memory device is controlled by applying a voltage through the source-drain shared area. The memory layer includes a charge trap layer and a threshold switching layer, and may realize a non-volatile multi-level memory function.

16 Claims, 27 Drawing Sheets

(51) Int. Cl.
*H01L 21/28* (2006.01)
*H01L 21/02* (2006.01)
*H01L 21/762* (2006.01)
*H01L 21/308* (2006.01)
*H01L 29/08* (2006.01)
*H01L 29/06* (2006.01)
*G11C 11/54* (2006.01)
*H01L 29/68* (2006.01)
*H01L 45/00* (2006.01)
*H01L 29/66* (2006.01)
*H01L 27/105* (2006.01)

(52) U.S. Cl.
CPC .......... *H01L 45/00* (2013.01); *H01L 27/1052* (2013.01); *H01L 29/66833* (2013.01)

(56) References Cited

U.S. PATENT DOCUMENTS

| | | |
|---|---|---|
| 8,001,065 B2 | 8/2011 | Tanaka et al. |
| 8,655,813 B2 | 2/2014 | Ananthanarayanan et al. |
| 8,812,414 B2 | 8/2014 | Arthur et al. |
| 8,892,487 B2 | 11/2014 | Chang et al. |
| 2003/0142533 A1 | 7/2003 | Ueda et al. |
| 2006/0118858 A1* | 6/2006 | Jeon .................. H01L 21/28273 257/321 |
| 2008/0043532 A1* | 2/2008 | Hara ...................... G11C 16/10 365/185.12 |
| 2008/0099825 A1* | 5/2008 | Ishii ...................... H01L 27/115 257/316 |
| 2009/0292661 A1 | 11/2009 | Haas |
| 2011/0215395 A1* | 9/2011 | Golubovic ........ H01L 27/11568 257/326 |
| 2012/0084240 A1 | 4/2012 | Esser et al. |
| 2012/0317063 A1 | 12/2012 | Sim et al. |
| 2013/0151451 A1 | 6/2013 | Lee et al. |
| 2014/0122102 A1 | 5/2014 | Utter, II |
| 2014/0122402 A1 | 5/2014 | Bichler et al. |
| 2015/0028278 A1 | 1/2015 | Lee et al. |
| 2015/0091080 A1* | 4/2015 | Sun .................... H01L 29/7881 257/326 |

* cited by examiner

METHOD OF FABRICATING SYNAPSE MEMORY DEVICE

CROSS-REFERENCE TO RELATED APPLICATION

This application claims the benefit of priority from Korean Patent Application No. 10-2015-0132605, filed on Sep. 18, 2015, in the Korean Intellectual Property Office, the disclosure of which is incorporated herein in its entirety by reference.

BACKGROUND

1. Field

Example embodiments relate to a method of fabricating a synapse memory device capable of being driven at a low voltage and realizing a multi-level memory.

2. Description of the Related Art

Flash memories are typically used as non-volatile memory devices. A charge trap flash (CTF) memory, which is a type of the flash memory, stores or deletes information by storing a charge in a charge trap layer, or removing the charge stored in the charge trap layer, by using a charge tunneling effect. A conventional charge trap flash memory has been known to have a transistor structure, and thus, is highly compatible with existing semiconductor processes and has a high degree of integration. Studies have been ongoing to lower an operating voltage and provide multi-level memory characteristics by improving such a charge trap flash memory device. Furthermore, the application of a memory device having multi-level memory characteristics to a neuromorphic device has been attempted.

SUMMARY

Example embodiments relate to a method of fabricating a synapse memory device capable of being driven at a low voltage such as, for example, lower than about 20 V, and realizing a multi-level memory.

Additional example embodiments will be set forth in part in the description which follows and, in part, will be apparent from the description, or may be learned by practice of the example embodiments.

According to an example embodiment, a method of fabricating a synapse memory device includes forming a first source region, a source-drain shared area, and a drain region by implanting a first conductivity-type dopant in regions of a substrate spaced apart from each other, forming a memory layer on a first channel region between the first source region and the source-drain shared area, forming a second gate electrode on a second channel region between the first source region and the source-drain shared area, and forming a first gate electrode on the memory layer.

The forming of the first source region, the source-drain shared area, and the drain region may include simultaneously or contemporaneously forming the first source region and the source-drain shared area, and forming the drain region during an operation that is different from the forming of the first source region and the source-drain shared area.

A depth profile of the first source region may be substantially the same as a depth profile of the source-drain shared area, and a depth profile of the drain region may be deeper than the depth profile of the first source region.

The method of fabricating the synapse memory device may further include forming a second source region by implanting a second conductivity-type dopant in a region of the substrate which contacts the first source region and is spaced apart from the first channel region, in which the second conductivity-type dopant may be different from the first conductivity-type dopant, and the first and second source regions may form a PN junction structure.

A depth profile of the second source region may be deeper than the depth profiles of the first source region and the source-drain shared area.

The depth profile of the second source region may be substantially the same as the depth profile of the drain region.

The method of fabricating the synapse memory device may further include forming a source electrode which electrically contacts the second source region.

The memory layer may include a charge trap layer formed on the first channel region and a threshold switching layer formed on the charge trap layer.

The charge trap layer may include $Si_3N_4$.

The threshold switching layer may include at least one of NiO, TaO, and $TiO_2$.

According to an example embodiment, a method of fabricating a synapse memory device includes forming a gate oxide layer on a substrate, forming an insulation layer on a portion of the substrate, forming a second gate electrode on a second channel region of the substrate, forming a drain region, the drain region contacting a side of the second channel region, forming a source-drain shared area and a first source region, the source-drain shared area contacting another side of the second channel region and a side of a first channel region, and the first source region contacting another side of the first channel region, forming a memory layer on the first channel region of the substrate, and forming a first gate electrode on the memory layer.

The insulation layer may be formed by a local oxidation of silicon (LOCOS) process.

The method of fabricating the synapse memory device may further include forming a second source region by implanting a second conductivity-type dopant which contacts the first source region and is spaced apart from the first channel region, in which the second conductivity-type dopant is different from the first conductivity-type dopant of the first source region, and the first and second source regions form a PN junction structure.

The method of fabricating the synapse memory device may further include forming a source electrode which electrically contacts the second source region.

The memory layer may include a charge trap layer formed on the first channel region and a threshold switching layer formed on the charge trap layer.

The charge trap layer may include $Si_3N_4$.

The threshold switching layer may include at least one of NiO, TaO, and $TiO_2$.

According to an example embodiment, a method of fabricating a synapse memory device includes providing a substrate having a stepped structure including a first plane area, a lateral surface, and a second plane area, forming a memory layer on the lateral surface, forming a first gate electrode on the memory layer, forming a second gate electrode on the second plane area, and forming a first source region, a source-drain shared area, and a drain region, in which the forming includes implanting a dopant in regions of the substrate defined by a mask formed from the first and second gate electrodes, in which the first plane area is higher than the second plane area by a height equal to a vertical height of the lateral surface.

The providing of the substrate having the stepped structure may include forming the lateral surface and the second plane area by etching the substrate by using the first plane area as a mask.

The method of fabricating the synapse memory device may further include forming an insulation layer on the first plane area by using a LOCOS process or a shallow-trench-isolation (STI) process.

Example embodiments relate to a method of fabricating synapse memory method of fabricating a synapse memory device, the method including forming a first source region, a source-drain shared area, and a drain region within a plurality of regions of a substrate, forming a memory layer on a first channel region between the first source region and the source-drain shared area, the memory layer including a charge trap layer and a threshold switching layer, forming a first gate electrode on the threshold switching layer, forming a second gate electrode on a second channel region between the source-drain shared area and the drain region. An operating voltage of the synapse memory device is lower than a threshold voltage, and a charge is captured in or emitted from the charge trap layer only when the operating voltage is above the threshold voltage.

BRIEF DESCRIPTION OF THE DRAWINGS

These and/or other example embodiments will become apparent and more readily appreciated from the following description, taken in conjunction with the accompanying drawings in which.

DETAILED DESCRIPTION

Figure 1:
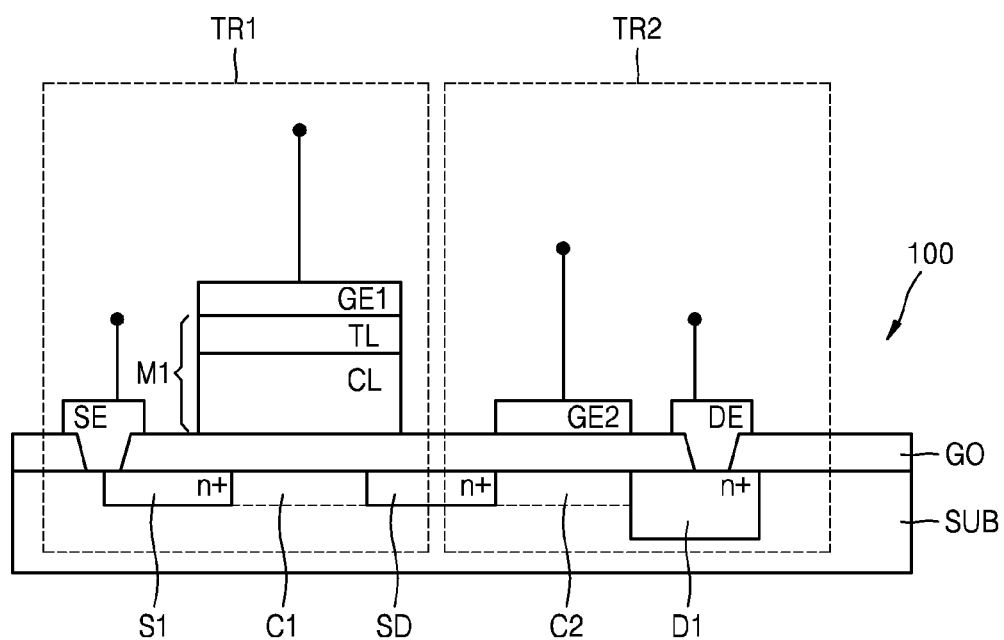
FIG. 1 is a sectional view of a synapse memory device, according to an example embodiment.

Reference will now be made in detail to example embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures. Expressions such as "at least one of," when preceding a list of elements, modify the entire list of elements and do not modify the individual elements of the list.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

A synapse memory device is a device imitating a biological function of a synapse. A neuron, which is a nerve cell in the brain, plays a main role in recognizing and processing information obtained through body's sensory organs. The neuron includes a dendrite receiving information, a soma corresponding to a cell body, and an axon transmitting information. A synapse indicates a gap between the axon of a pre-neuron of transmitting information and the dendrite of a post-neuron of receiving information. Generally, a neuron has about $10^3$~$10^4$ synapses and is connected to different neurons via the synapses. Such operation between neurons may enhance energy efficiency and allow information processing and learning to be performed in parallel. As various analog signals are integrated in a cell body of the neuron and the sum of the signals becomes larger than a threshold voltage, an action potential is generated with a width of about 1 ms and a constant intensity. This may be understood as a digital signal including a series of pulses. The neuron may process analog signals and their respective action potentials as digital signals and therefore express meaningful information as a number of pulses per unit time rather than amplitude. Furthermore, the neuron may operate as a memory and/or a processor. When frequent irritation is applied to a pre-synapse, the neuron becomes sensitive to irritation as increasing electrical conductivity of a post-synapse. When irritation is infrequently applied to a pre-synapse, the neuron becomes less sensitive to irritation as decreasing electrical conductivity of a post-synapse. Therefore, a synapse memory device copying such a synapse may change weight corresponding to an input signal (synapse plasticity). The synapse memory device according to the example embodiments may realize the weight as magnitude of a charge stored in a charge trap layer of a memory layer. Sensitivity with respect to electrical conductivity of an actual synapse may correspond to the number of levels of the synapse memory device and a charge amount stored in each charge trap layer of the synapse memory device. Furthermore, a non-volatile memory device may be realized by including a threshold switching layer in the memory layer. A neuromorphic network may be realized by connecting a plurality of synapse memory devices. Hereinafter, a specific configuration of a synapse memory device will be described in detail with reference to the following figures.

FIG. 1 is a cross-sectional view of a synapse memory device 100 according to an example embodiment. Referring to FIG. 1, the synapse memory device 100 may be arranged on a substrate SUB. The synapse memory device 100 may include a first transistor TR1 including a first channel region C1 and a second transistor TR2 including a second channel region C2. The synapse memory device 100 according to the example embodiment may be or include a four-terminal synapse memory device operated by four electrodes. A source-drain shared area SD of the synapse memory device 100 may be provided between the first and second channel regions C1 and C2. The first transistor TR1 and the second transistor TR2 may share the source-drain shared area SD as a drain region and a first source region, respectively.

The first transistor TR1 may include a memory layer M1 on the first channel region C1 and a first gate electrode GE1 on the memory layer M1. Furthermore, the first transistor TR1 may include a source electrode SE1 electrically connected to the first source region S1. A gate oxide layer GO may be provided on the substrate SUB. The gate oxide layer GO may include silicon oxide. The gate oxide layer GO may play a role of a buffer layer.

The second transistor TR2 may include a second gate electrode GE2 on the second channel region C2. Furthermore, the second transistor TR2 may include a drain electrode DE electrically connected to the drain region D1. The gate oxide layer GO may play a role of a gate oxide layer of the second transistor TR2.

The substrate SUB may be, for example, a silicon (Si) substrate. The synapse memory device 100 may be an N-channel metal oxide semiconductor (NMOS) type device or a P-channel metal oxide semiconductor (PMOS) type device. For example, a synapse memory device of an NMOS type may be realized by doping a Si substrate with a p-type dopant and by doping the first source region S1, the source-drain shared area SD, and the drain region D1 with an n-type dopant. Alternatively, a synapse memory device of a PMOS type may be realized by doping a Si substrate with an n-type dopant and by doping the first source region S1, the source-drain shared area SD, and the drain region D1 with a p-type dopant. The example embodiment is described based on an NMOS type device, but may also be based on a PMOS type device.

In at least one example embodiment, the memory layer M1 may include a charge trap layer CL formed on the first channel region C1 and a threshold switching layer TL formed on the charge trap layer CL. A material forming the charge trap layer CL may include, for example, silicon nitride ($Si_3N_4$) or polycrystalline silicon. A maximum charge amount that can be stored in the charge trap layer CL may be proportional to a volume of the charge trap layer CL. A charge stored in the charge trap layer CL may play a role of a non-volatile memory maintained even when a voltage is not applied to the synapse memory device 100, as the threshold switching layer TL reduces or substantially prevents leakage of a charge. Binary information may be stored in the charge trap layer CL based on whether a charge is stored in the charge trap layer CL. For example, "1" may indicate that a charge is stored in the charge trap layer CL and "0" may indicate that a charge is not stored in the charge trap layer CL. Furthermore, the charge trap layer CL may function as a multi-level memory cell capable of storing multiple pieces of information step-by-step, according to a stored charge amount. For example, if a maximum charge which may be stored in the charge trap layer CL is 100%, a time point when no charge is stored may be "0," a time point when a 25% charge is stored may be "1," a time point when a 50% charge is stored may be "2," a time point when a 75% charge is stored may be "3," and a time point when a 100% charge is stored may be "4." The synapse memory device 100 may store 4-bit information in a memory layer. Furthermore, levels may be determined based on a charge amount stored in the charge trap layer CL. As the charge amount is divided among multiple levels, more information may be stored in a device, but errors may increase. Therefore, it is possible to realize a multi-level memory having fewer errors and being capable of storing more information by increasing the size of the charge trap layer CL such that a charge amount to be stored is increased. Such a multi-level memory may store multi-bit information in a memory layer, and the memory device may be used as a synapse memory device for a neural network. The charge trap layer CL may include the threshold switching layer TL to minimize or prevent charge leakage and inhibit or substantially prevent the charge trap layer CL from being volatilized when a voltage is not applied to a multi-level memory. As a result, the charge trap layer CL may have the characteristic of a non-volatile synapse memory device. The threshold switching layer TL may have the characteristic of a variable resistance material in which the resistance thereof changes according to an applied voltage. Therefore, as the applied voltage increases, the resistance is decreased to allow current to flow easily, and as the applied voltage decreases, the resistance is increased to reduce or substantially prevent current from flowing easily. The threshold switching layer TL may be non-linear rather than linear so that a large amount of current flows relatively fast when a voltage above a certain level, for example, a voltage above a threshold voltage of substantially 20 V, is applied. At the threshold voltage, resistance is suddenly decreased and a large amount of current flows. Furthermore, the threshold switching layer TL may have a characteristic of a switching device since the current flows when the applied voltage reaches or exceeds the threshold voltage and substantially does not flow when the applied voltage is below the threshold voltage of, for example, about 20 V. Moreover, since the threshold switching layer TL is able to store a charge without using a tunneling method, the life of a device may be extended because any deterioration of an interface state due to repeated use of the device is reduced or substantially prevented. Components of the threshold switching layer TL may include at least one of, for example, titanium (Ti) oxide, tantalum (Ta) oxide, nickel (Ni) oxide, zinc (Zn) oxide, tungsten (W) oxide, cobalt (Co) oxide, niobium (Nb) oxide, titanium-nickel (TiNi) oxide, lithium-nickel (LiNi) oxide, indium-zinc (InZn) oxide, vanadium (V) oxide, SrZr oxide, strontium-titanium (SrTi) oxide, chromium (Cr) oxide, iron (Fe) oxide, copper (Cu) oxide, hafnium (Hf) oxide, zirconium (Zr) oxide, aluminum (Al) oxide, and a mixture thereof.

Figure 2:
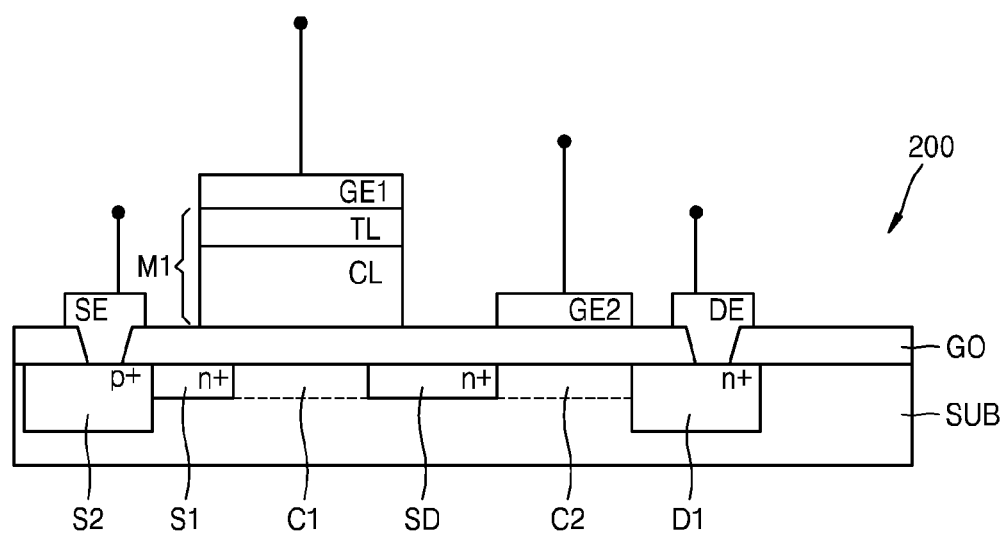
FIG. 2 is a sectional view of a synapse memory device, according to another example embodiment.

FIG. 2 is a sectional view of a synapse memory device 200 according to another example embodiment. Referring to FIG. 2, the synapse memory device 200 may include a first source region S1 and may include a second source region S2 including a conductivity-type dopant that is different from that of the first source region S1. The first source region S1 and the second source region S2 may form a PN junction structure. For example, in the case of an NMOS synapse memory device, the first source region S1 contacting the first channel region C1 may be formed by implanting the first conductivity-type dopant in the substrate SUB, and the second source region S2 located at another side of the first source region S1 may be formed by implanting the second conductivity-type dopant in the substrate SUB which contacts the first source region S1. For example, when the first conductivity-type dopant is an n-type dopant, the second conductivity-type dopant is a p-type dopant. Furthermore, when the first conductivity-type dopant is a p-type dopant, the second conductivity-type dopant is an n-type dopant. A depth profile of the second source region S2 may be substantially the same as or deeper than the depth profile of the first source region S1. Current leakage of a device may be adjusted based on the difference between the depth profiles. In the case of a PMOS synapse memory device, the PN junction structure may be formed in an opposite direction by implanting a p-type dopant in the first source region S1 and an n-type dopant in the second source region S2. The PN junction structure may reduce or substantially prevent a backflow of current of the synapse memory device 200 according to the example embodiment.

Figure 3:
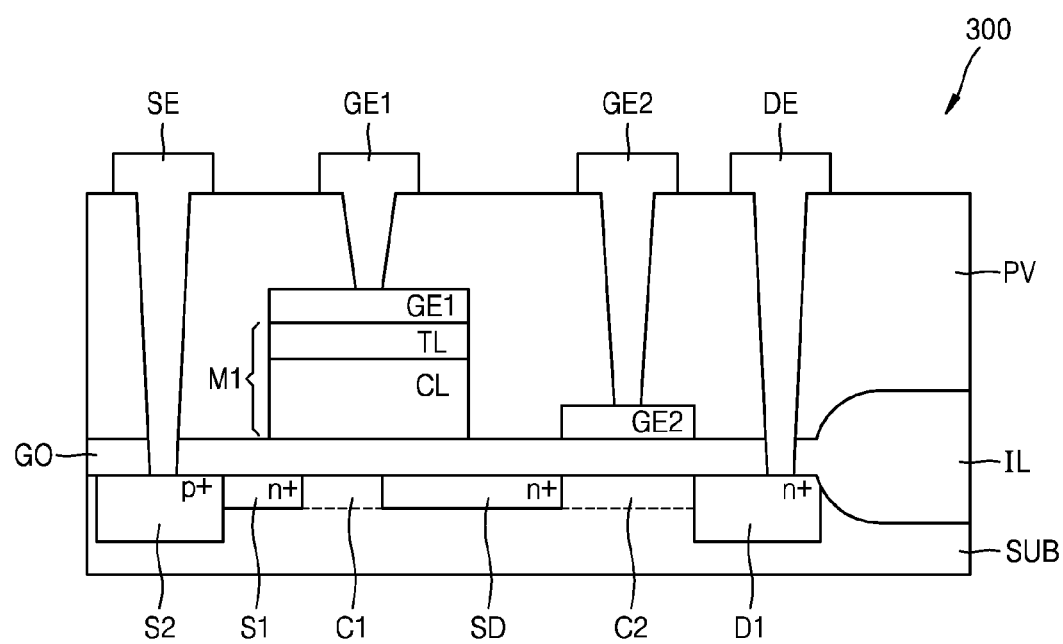
FIG. 3 is a sectional view of a synapse memory device forming a passivation layer and an electrode on the synapse memory device, according to the example embodiment of FIG. 2.

FIG. 3 is a sectional view of a synapse memory device 300 forming a passivation layer PV and an electrode on the synapse memory device 200 according to the example embodiment of FIG. 2. Referring to FIG. 3, the passivation layer PV for protecting the synapse memory device 300 may be provided on a substrate SUB to cover first and second transistors TR1 and TR2. Components of the passivation layer PV may include an oxide film or a polymer such as a polyimide (PI) or an epoxy. Furthermore, the passivation layer PV may include an insulation layer IL to reduce or substantially prevent current leakage between a plurality of synapse memory devices. The passivation layer PV may include a via hole formed therein and an electrode formed in the via hole by implanting a conductive material in the via hole. For example, the electrode may include a metal having high electric conductivity such as palladium (Pd), platinum (Pt), ruthenium (Ru), gold (Au), silver (Ag), molybdenum (Mo), magnesium (Mg), aluminum (Al), tungsten (W), titanium (Ti), irridium (Ir), nickel (Ni), chromium (Cr), neodymium (Nd), or copper (Cu). Furthermore, the electrode may include graphene or a transparent conductive metal oxide such as indium tin oxide (ITO), indium zinc oxide (IZO), aluminum zinc oxide (AZO), or gallium zinc oxide (GZO). The electrode may include a source electrode SE connected to a second source region S2, first and second gate electrodes GE1 and GE2, and a drain electrode GE connected to a drain region D1. The synapse memory device 300 according to the example embodiment may have a four-terminal structure operated by four electrodes.

The synapse memory device 300 may be operated by applying a voltage to each electrode of the synapse memory device 300. The charge stored in a charge trap layer CL may be read by applying a read voltage to the source electrode SE. When the read voltage is applied to the source electrode SE, a sensing current may flow through a first channel region C1. The amount of the sensing current may be changed according to the amount of a charge captured in the charge trap layer CL located in the first channel region C1. Therefore, when a fixed read voltage is applied, multi-level information may be read by dividing the read sensing current according to each, or one or more, of the levels. The first channel region C1 may have a depletion mode. Therefore, the smaller the charge amount captured in the charge trap layer CL, the larger the sensing current, and the larger the charge amount captured in the charge trap layer CL, the smaller the sensing current. The amount of the sensing current which flows is largest when substantially no charge is captured.

A write voltage may be applied to drain electrode DE. The write voltage applied to the drain electrode DE may be transmitted to a source-drain shared SD through the second channel region C2 and provide a voltage required for the write operation of the synapse memory device. When a voltage applied to a threshold switching layer TL is substantially the same as or higher than the threshold voltage, a charge passes through the first gate electrode GE1 and the threshold switching layer TL and is captured in the charge trap layer CL, and thus, a write operation may be performed. The charge may not pass through the charge trap layer CL when the voltage applied to the threshold switching layer TL is substantially the same as or lower than the threshold voltage. A multi-level memory function may be obtained according to the amount of the charge stored in the charge trap layer CL. During the above read operation, an electric field corresponding to the amount of the stored charge is formed in the first channel region C1 located below the charge trap layer CL, and may change the amount of the sensing current flowing along the first channel region C1.

A second channel region C2 may be turned on/off based on a voltage applied to the second gate electrode GE2. When a voltage of a certain level or more is applied to the second gate electrode GE2, a sensing current may flow through the second channel region C2, and the sensing current may not flow through the second channel region C2 unless said voltage is applied to the second gate electrode GE2. The second channel region C2 may be in an enhanced mode while the first channel region C1 is in a depletion mode. A synapse memory device may be selected based on a voltage applied to the second gate electrode GE2. When a voltage is not applied to the second gate electrode GE2, the second channel region C2 is closed and read, write, and erase operations may not be performed. The read, write, and erase operations may be performed on the corresponding synapse memory device only when a voltage equal to or greater than an activation voltage is applied to the second gate electrode GE2, thereby activating the second channel region C2.

An erase voltage may be applied to a first electrode GE1. An electric field may be formed in the threshold switching layer TL, the charge trap layer CL, and the first gate electrode GE1 due to the erase voltage transmitted to the charge trap layer CL. Here, voltage may be distributed according to the resistance value of each layer. A charge is or emitted from the charge trap layer CL when the magnitude of a voltage applied to the threshold switching layer TL is higher than a threshold voltage. When the magnitude of the applied voltage is lower than the threshold voltage, no charge emitted from the charge trap layer CL.

In short, the source electrode SE may be related to the read operation, the second gate electrode GE2 may be related to selection of a synapse memory device and read, write and erase operations related to the selected synapse memory device, and the first gate electrode GE1 and the drain electrode DE may be related to write and erase operations.

Figure 4A:
FIGS. 4A through 4H are sectional views illustrating a method of forming an insulation layer for reducing or substantially preventing current leakage between synapse memory devices, according to example embodiments.
Figure 4B:
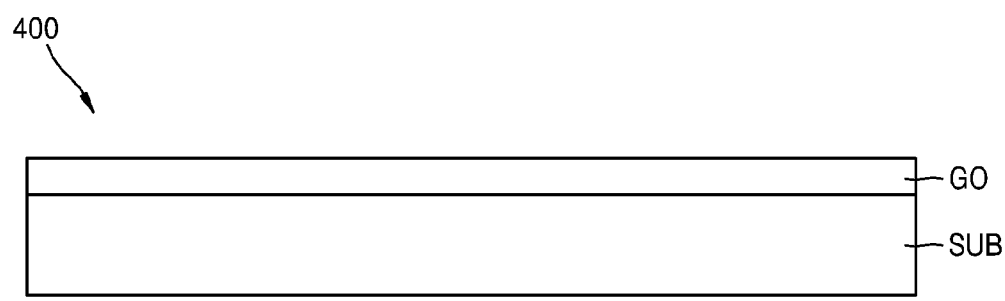
Figure 4C:
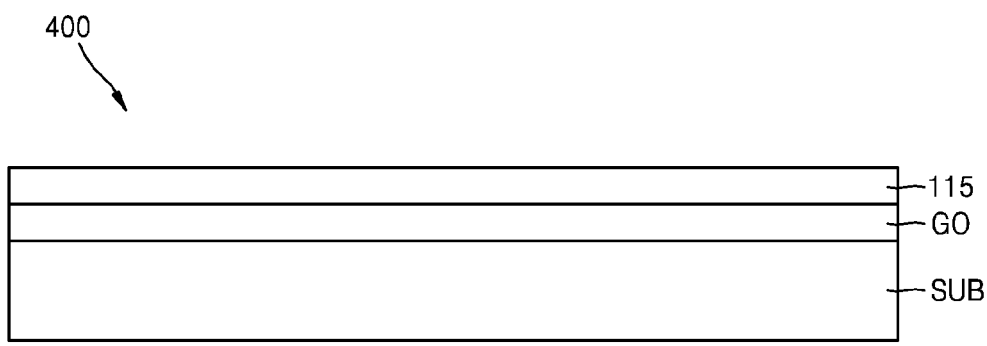
Figure 4D:
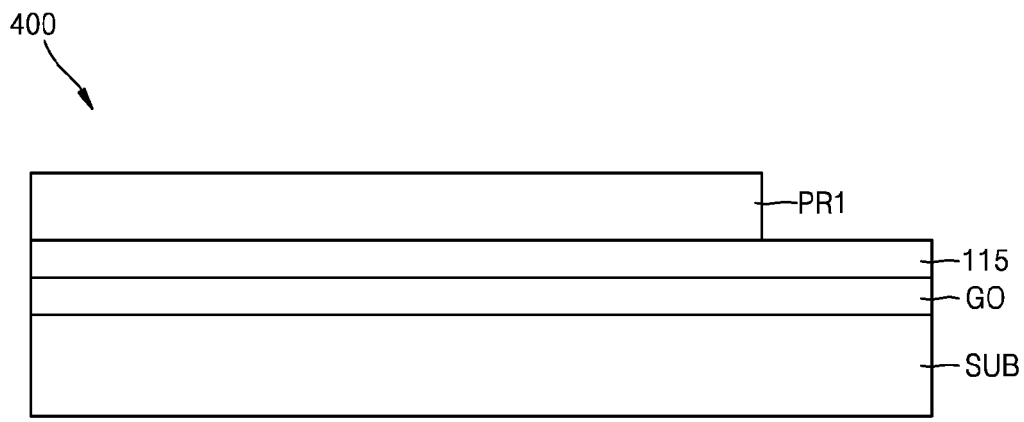
Figure 4E:
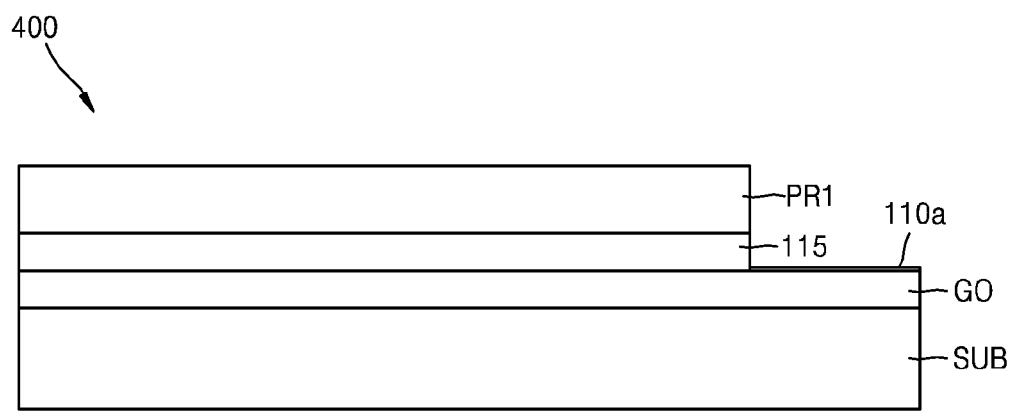
Figure 4F:
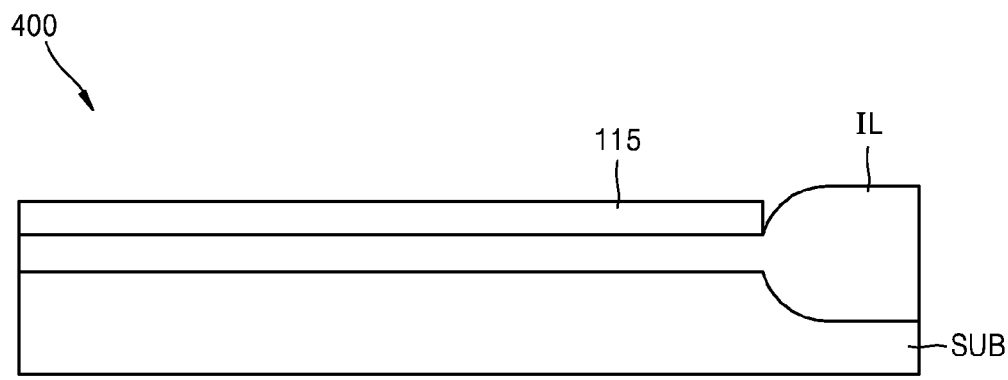
Figure 4G:
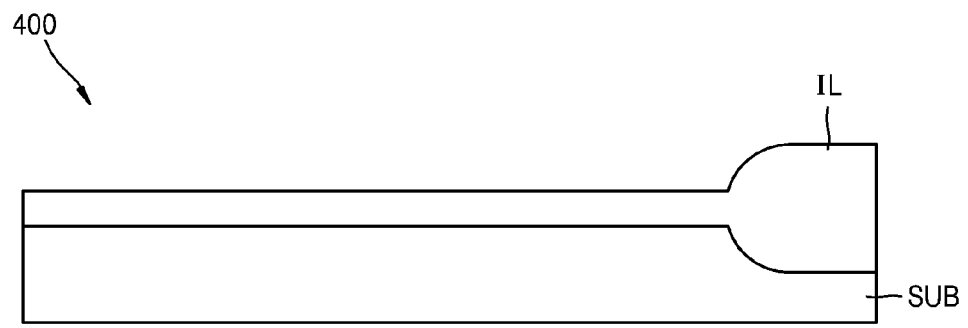
Figure 4H:
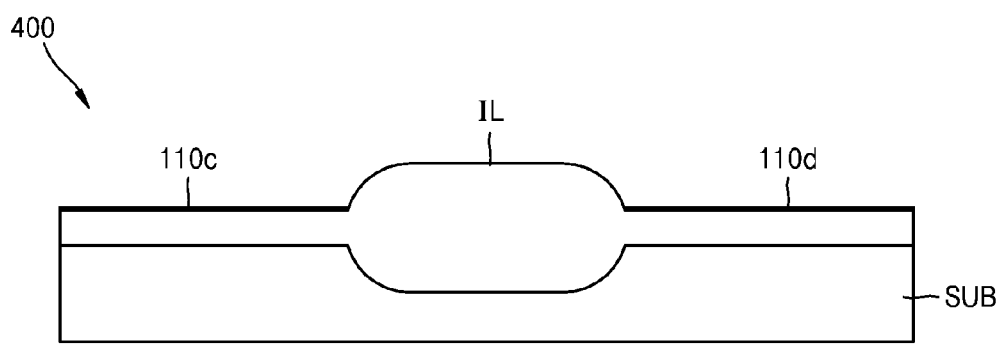

FIGS. 4A through 4H are sectional views illustrating a method of forming an insulation layer IL for reducing or substantially preventing current leakage between synapse memory devices 400 according to example embodiments. When a plurality of synapse memory devices are provided on a substrate SUB, current leakage between the adjacent synapse memory devices may result. The current leakage may deteriorate performance of the synapse memory devices 400 and may be reduced or substantially prevented by forming the insulation layer IL. For example, the insulation layer IL may be formed by a local oxidation of silicon (LOCOS) process. In the LOCOS process, an insulation layer is formed by selectively growing a silicon oxide in a region, for example a specific region, on a substrate during an integrated circuit fabrication process. In the LOCOS process, since the silicon oxide is formed considerably deeper than a surface of a silicon substrate, the silicon oxide may play a role of an insulator reducing or substantially preventing a current from penetrating through the silicon substrate. Referring to FIG. 4A, the substrate SUB may be provided. The substrate SUB may be silicon. In the case of an NMOS type synapse memory device, the substrate SUB may be implanted with, for example, a p-type dopant. Referring to FIG. 4B, a gate oxide layer GO may be formed on the substrate SUB. In general, the gate oxide layer GO may include silicon oxide ($SiO_2$). The gate oxide layer GO may be formed by chemical vapor deposition (CVD). The gate oxide layer GO may have a thickness of about 7 nm or less. Referring to FIG. 4C, a nitride layer 115 may be formed on the gate oxide layer GO. The nitride layer 115 may include $Si_3N_4$. The nitride layer 115 may be formed by CVD. Referring to FIG. 4D, a first photoresist pattern PR1 may be formed on the nitride layer 115. The first photoresist pattern PR1 may include a pattern for distinguishing a region in which the insulation layer IL is formed. Referring to FIG. 4E, the nitride layer 115 may be etched by using the first photoresist pattern PR1 as a mask. An insulation layer may be formed through the LOCOS process in a portion 110a where the gate oxide layer GO is exposed due to the etching. Referring to FIG. 4F, the insulation layer IL may be formed by removing the first photoresist pattern PR1 and heating the portion 110a. The insulation layer IL may be formed to be deeper than an upper surface of the substrate SUB. Referring to FIG. 4G, the nitride layer 115 may be removed from the gate oxide layer GO after the insulation layer IL is formed. Referring to FIG. 4H, device fabricating regions 110c and 110d on the substrate SUB may be distinguished based on the insulation layer IL.

The above example embodiment explains a method of forming the insulation layer IL by using the LOCOS process, but the formation of the insulation layer IL is not limited thereto. In another example embodiment, the insulation layer IL may be formed by, for example, shallow-trench-isolation (STI).

FIGS. 5A through 5L are sectional views illustrating a method of fabricating a synapse memory device 500, according to an example embodiment.

Figure 5A:
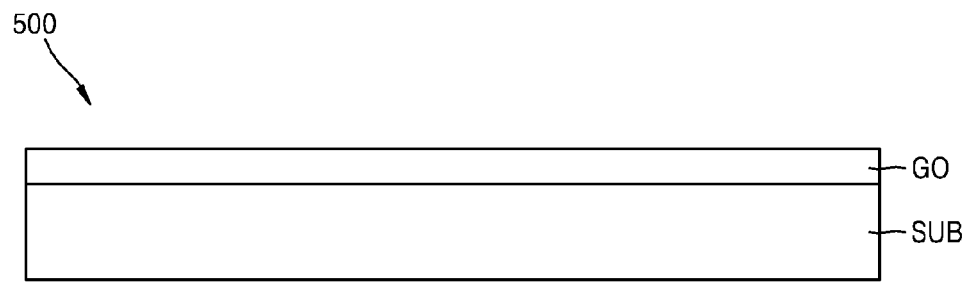
FIGS. 5A through 5L are sectional views illustrating a method of fabricating a synapse memory device, according to an example embodiment.

Referring to FIG. 5A, a substrate SUB may be provided. The substrate SUB may be formed of or include silicon. A p-type dopant may be implanted in a substrate SUB to form an NMOS synapse memory device. A gate oxide layer GO may be formed on the substrate SUB. The gate oxide layer GO may include silicon oxide ($SiO_2$). The gate oxide layer GO may play the role of a buffer layer which stabilizes the device.

Figure 5B:
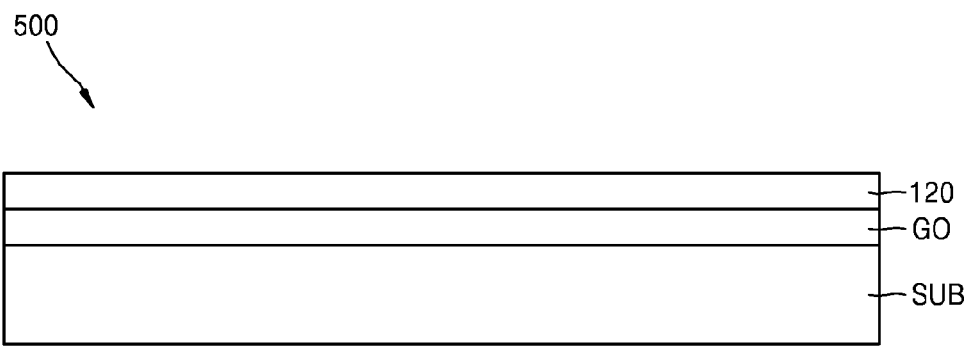

Referring to FIG. 5B, a second gate electrode layer 120 may be formed on the substrate SUB to form a second gate electrode GE2. The second gate electrode layer 120 may include polysilicon. The second gate electrode layer 120 may be formed by spin coating and CVD.

Figure 5C:
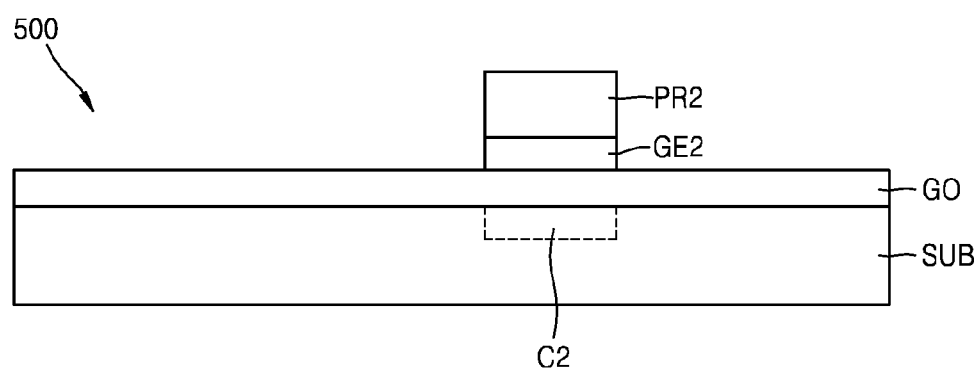

Referring to FIG. 5C, a second photoresist pattern PR2 may be used to form the second gate electrode GE2. The second photoresist pattern PR2 may be located on a second channel region C2 of the substrate SUB. The second gate electrode GE2 may be formed by etching the second gate electrode layer 120 while using the second photoresist pattern PR2 as a mask. The second gate electrode GE2 may be located on the second channel region C2.

Figure 5D:
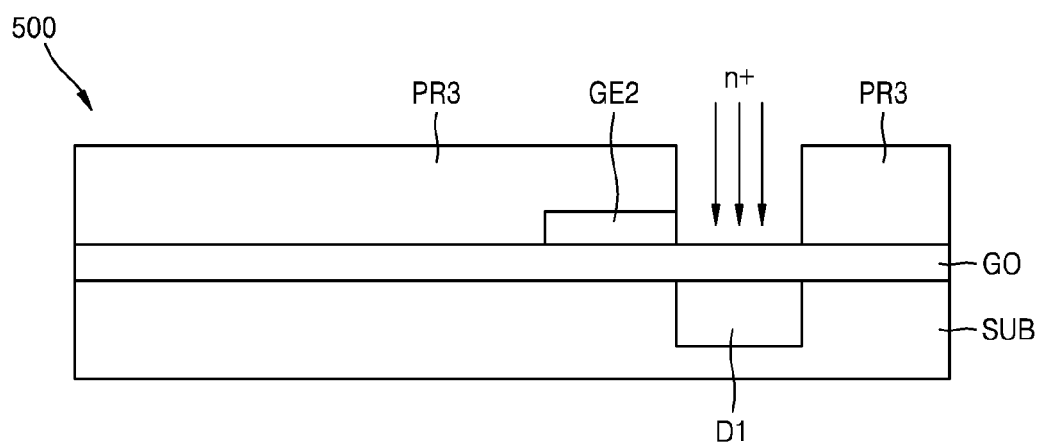

Referring to FIG. 5D, a drain region D1 may be formed by implanting a first conductivity-type dopant in a region of the substrate SUB that is located to the side of the second gate electrode GE2. For example, the first conductivity-type dopant may be an n-type dopant. The position of the drain region D1 may be adjusted based on a third photoresist pattern PR3. For example, the drain region D1 may be formed by forming the third photoresist pattern PR3 on the substrate SUB and by implanting a dopant in the substrate SUB by using the third photoresist pattern PR3 as a mask. The n-type dopant may include, for example, phosphorus (P). The n-type dopant may be implanted via ion implantation. A depth profile of the drain region D1 may be adjusted according to an implantation time or an acceleration voltage of the n-type dopant. Formation of the drain region D1 may be unrelated to an operation of forming a first source region S1 and a source-drain shared area SD. Therefore, the depth profile of the drain region D1 may be adjusted to be different from depth profiles of the first source region S1 and the source-drain shared area SD, and thus, current leakage of the synapse memory device 500 may be reduced or substantially prevented.

Figure 5E:
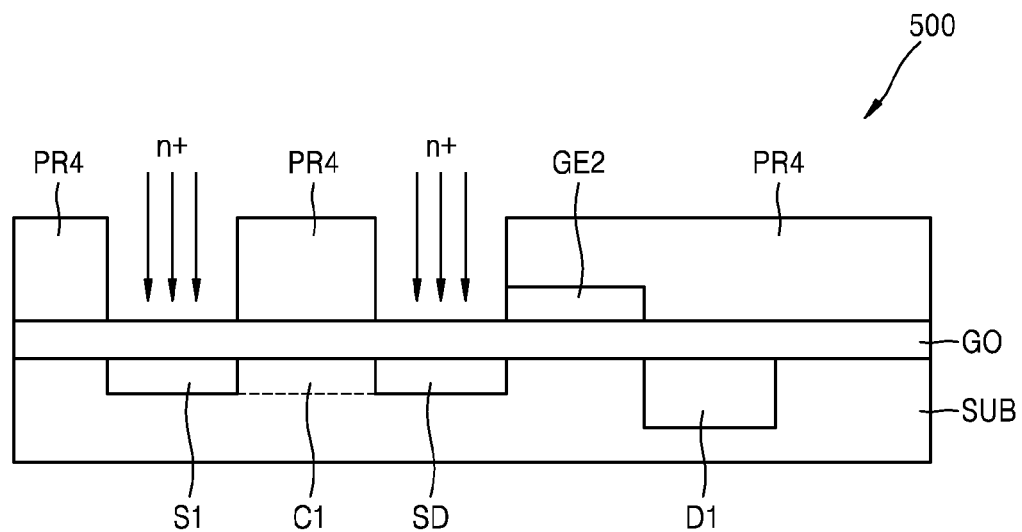

Referring to FIG. 5E, the first source region S1 and the source-drain shared area SD may be formed by implanting the first conductivity-type dopant in the substrate SUB. The first source region S1, the source-drain shared area SD, and the drain region D1 may be formed to be spaced apart from each other. Positions of the first source region S1 and the source-drain shared area SD may be adjusted based on a fourth photoresist pattern PR4. The fourth photoresist pattern PR4 may be formed on the substrate SUB and an n-type dopant may be implanted by using the fourth photoresist pattern PR4 as a mask in order to form the first source region S1 and the source-drain shared area SD. The n-type dopant may include, for example, phosphorus (P). The n-type dopant may be implanted via ion implantation. Depth profiles of the first source region S1 and the source-drain shared area SD may be adjusted according to an implantation time or an acceleration voltage of the n-type dopant, and may be shallower than the depth profile of the drain region D1. A substrate SUB region between the first source region S1 and the source-drain shared area SD may be or include a first channel region C1 and a substrate SUB region between the source-drain shared area SD and the drain region D1 may be or include a second channel region C2.

Figure 5F:
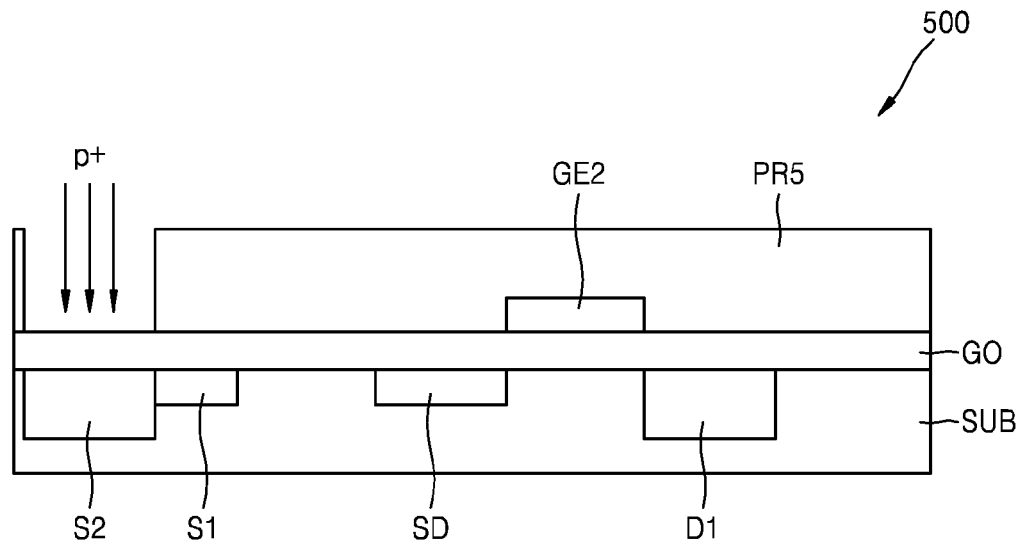

Referring to FIG. 5F, a second source region S2 may be formed by implanting a second conductivity-type dopant in the substrate SUB. The second conductivity-type dopant may be different from the first conductivity-type dopant. For example, the second conductivity-type dopant may be a p-type dopant. In other words, the second source region S2 may be formed of or include a p-type dopant while the first source region S1 may be formed of or include an n-type dopant. For example, the p-type dopant may include boron (B). The first source region S1 and the second source region S2 may form a PN junction structure. The position of the second source region S2 may be adjusted based on a fifth photoresist pattern PR5. For example, the second source region S2 may be located in a substrate SUB region, for example adjacent to and contacting the first source region S1. The fifth photoresist pattern PR5 may expose the substrate SUB region corresponding to the position of the second source region S2. Current leakage of the synapse memory device 500 may be reduced due to the PN junction structure formed by the first source region S1 and the second source region S2. A depth profile of the second source region S2 may be deeper than the depth profiles of the first source region S1 and of the source-drain shared area SD, and may be substantially the same as the depth profile of the drain region D1. The current leakage may be adjusted by setting the depth profiles of the first and second source regions S1 and S2, a source-drain shared area SD, and a drain region D1. The depth profiles of the second source region S2 and the drain region D1 may be deeper than the depth profiles of the first source region S1 and of the source-drain shared area SD in the synapse memory device 500, according to the example embodiment, but are not limited thereto.

Figure 5G:
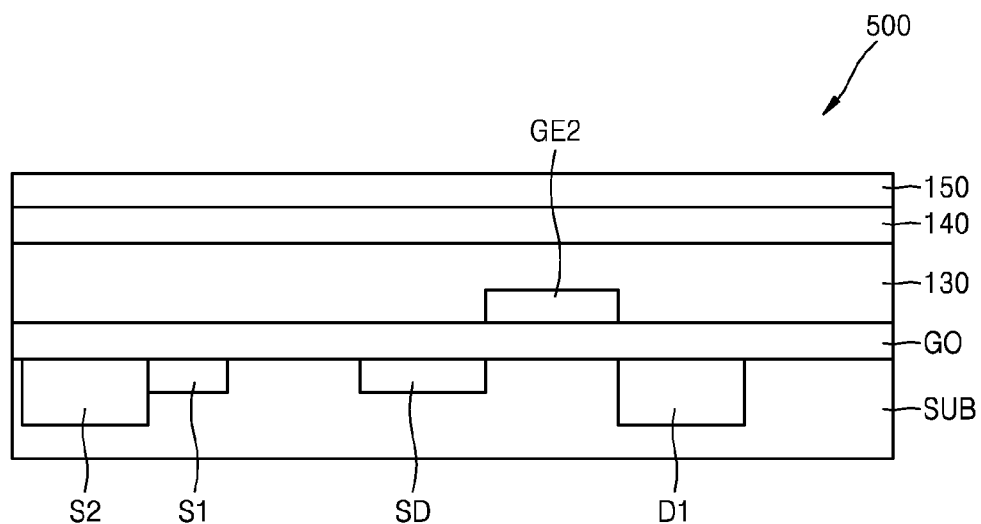

Referring to FIG. 5G, a charge trap layer 130, a threshold switching layer 140, and a first gate electrode layer 150 are may be formed on the substrate SUB. The charge trap layer 130 may include silicon nitride ($Si_3N_4$). For example, components of the threshold switching layer 140 may include at least one of Ti oxide, Ta oxide, Ni oxide, Zn oxide, W oxide, Co oxide, Nb oxide, TiNi oxide, LiNi oxide, InZn oxide, V oxide, SrZr oxide, SrTi oxide, Cr oxide, Fe oxide, Cu oxide, Hf oxide, Zr oxide, Al oxide, and a mixture thereof. For example, the first gate electrode layer 150 may use a metal having a high electric conductivity such as, for example, Pd, Pt, Ru, Au, Ag, Mo, Mg, Al, W, Ti, Ir, Ni, Cr, Nd, or Cu. Furthermore, the electrode may include graphene or a transparent conductive metal oxide such as ITO, IZO, AZO, or GZO.

Figure 5H:
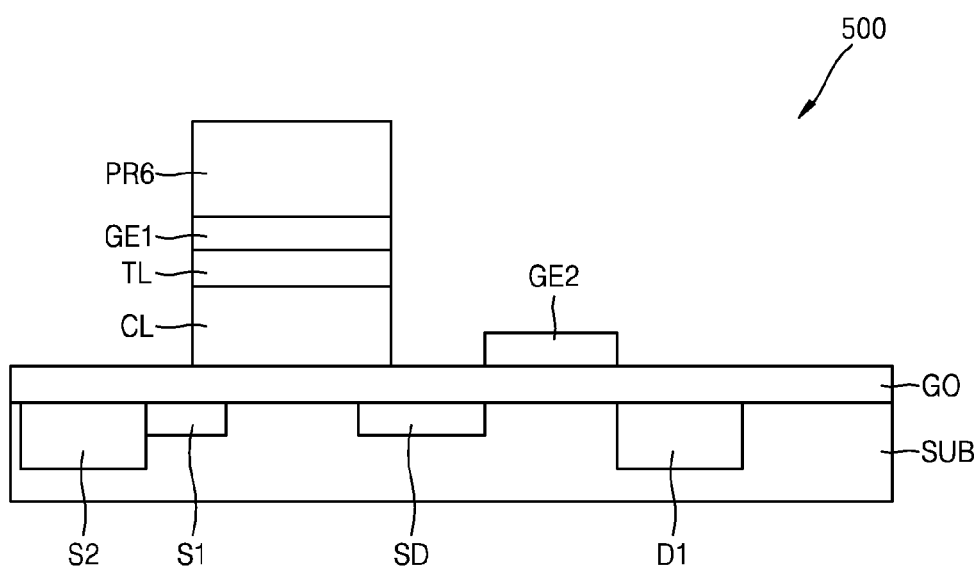

Referring to FIG. 5H, a charge trap layer CL performing a memory function, a threshold switching layer TL realizing a switching function, and a first gate electrode GE1 may be formed on the second channel region C2. The charge trap layer 130, the threshold switching layer 140, and the first gate electrode layer 150 may be etched by using a sixth photoresist pattern PR6 as a mask in order to form the charge trap layer CL, the threshold switching layer TL, and the first gate electrode GE1.

Figure 5I:
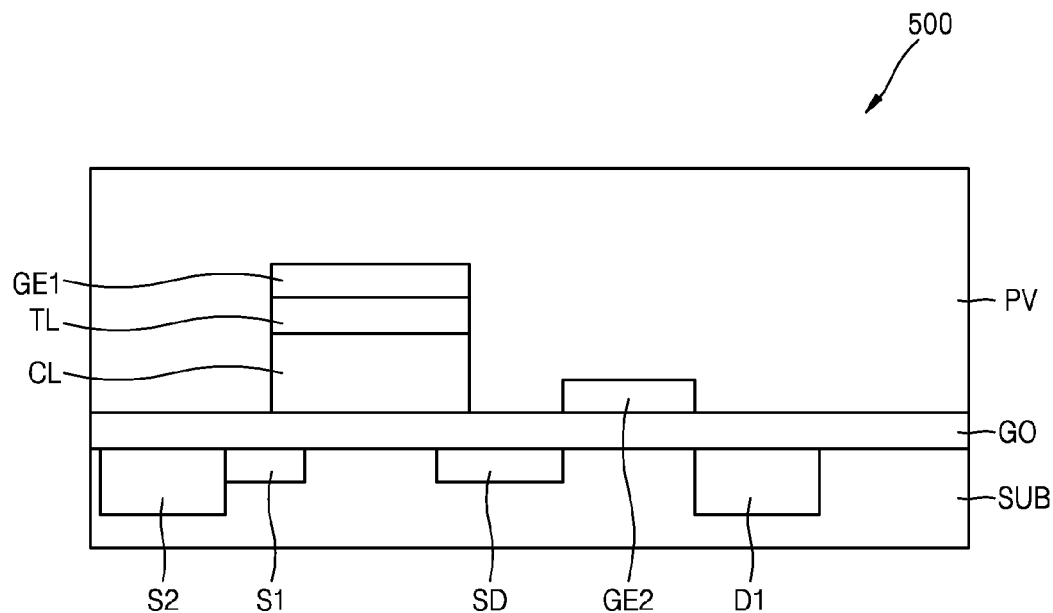

Referring to FIG. 5I, a passivation layer PV may be formed on the substrate SUB. The passivation layer PV may cover the first and second transistors TR1 and TR2 formed on the substrate SUB. The passivation layer PV may include a polymer such as an oxide film, PI or epoxy.

Figure 5J:
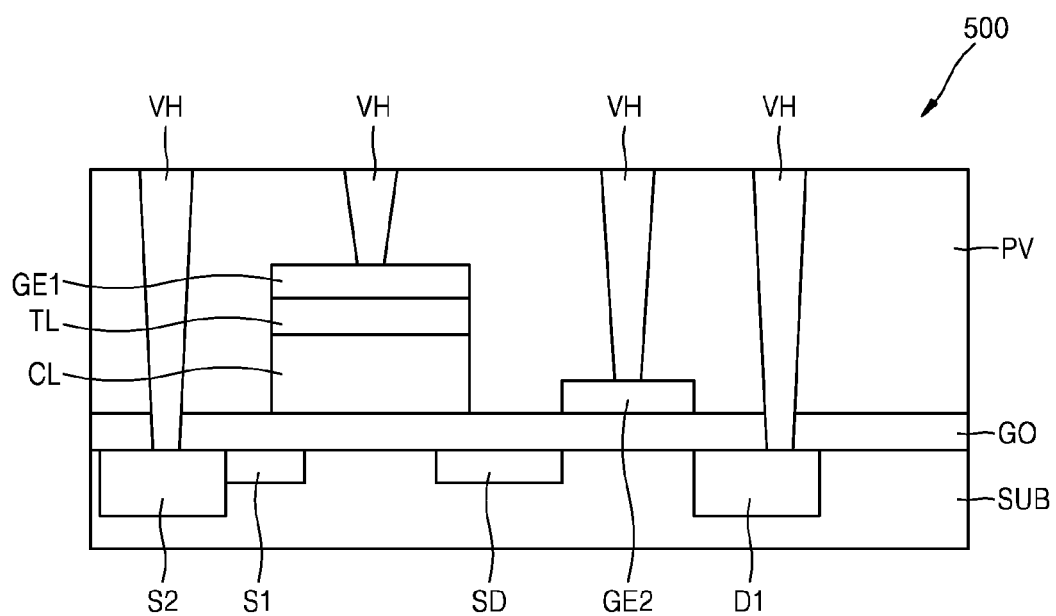

Referring to FIG. 5J, a via hole VH may be formed in the passivation layer PV. The via hole VH may expose a first source region S1, a drain region D1, first and second gate electrodes GE1 and GE2.

Figure 5K:
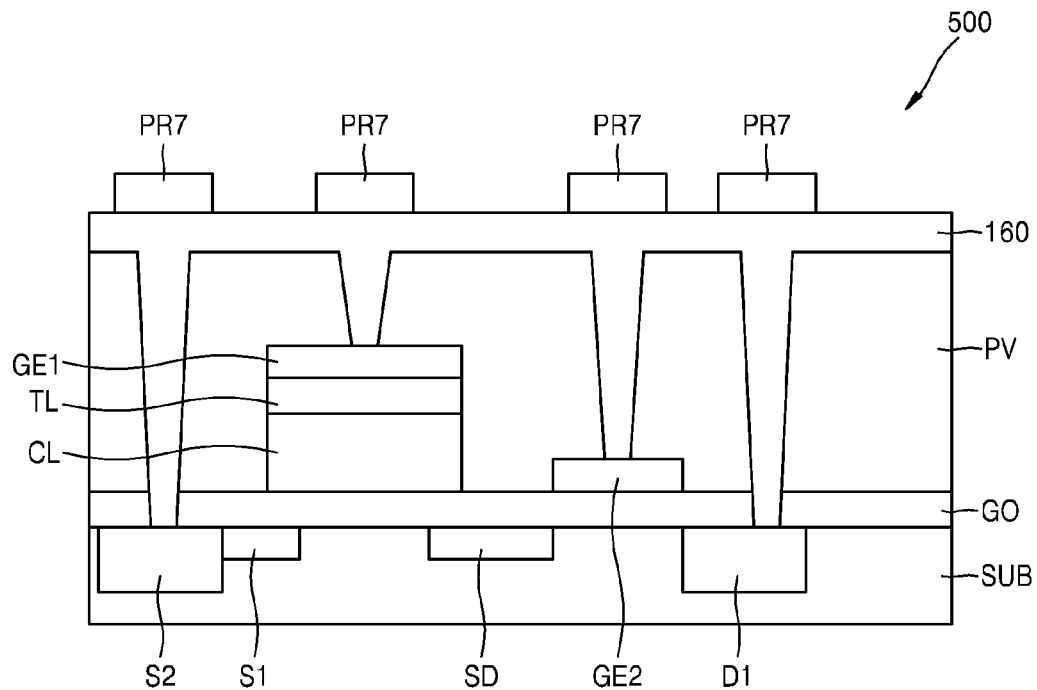

Referring to FIG. 5K, an electrode layer 160 may be formed by implanting a conductive material in the via hole VH. Furthermore, a seventh photoresist pattern PR7 may be formed on the electrode layer 160. The seventh photoresist pattern PR7 may be or include a mask for etching the electrode layer 160. The electrode layer 160 may, for example, use a metal having high electric conductivity such as, for example, Pd, Pt, Ru, Au, Ag, Mo, Mg, Al, W, Ti, Ir, Ni, Cr, Nd, or Cu. Furthermore, the electrode layer 160 may include graphene or a transparent conductive metal oxide such as ITO, IZO, AZO, or GZO.

Figure 5L:
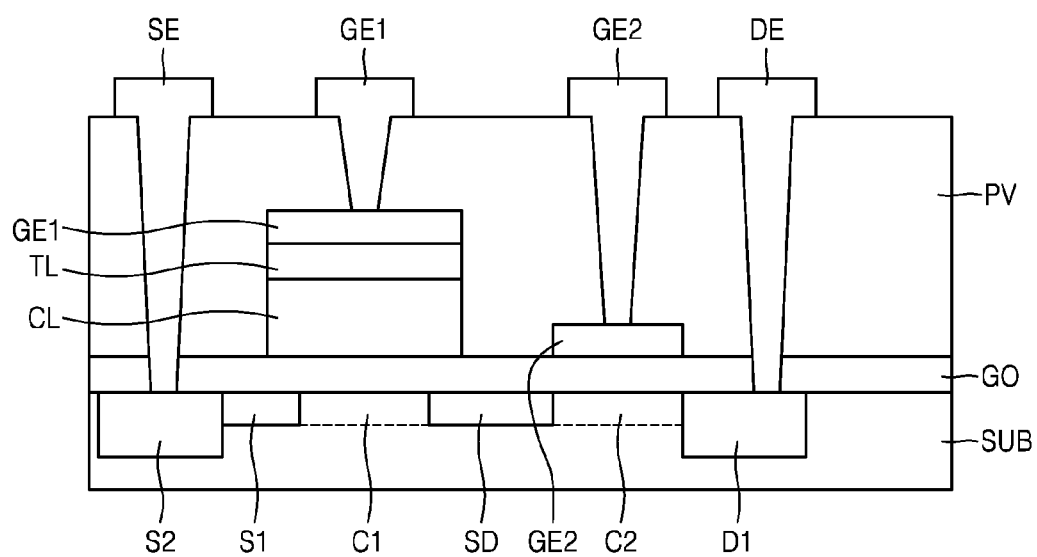

Referring to FIG. 5L, an electrode of the synapse memory device 500 may be formed by etching the electrode layer 160 by using a seventh photoresist pattern PR7 as a mask. The electrode may include a source electrode SE contacting a second source region S2, first and second gate electrodes GE1 and GE2, and a drain electrode DE contacting a drain region D1. Referring to FIG. 5L, a salient part of the source electrode SE, the first and second gate electrodes GE1 and GE2, and the drain electrode DE are located on the substrate SUB at the same level, but are not limited thereto. The source electrode SE, the first and second gate electrodes GE1 and GE2, and the drain electrode DE may be respectively located on different layers according to designs of a front end of line (FEOL) and a back end of line (BEOL).

Figure 6:
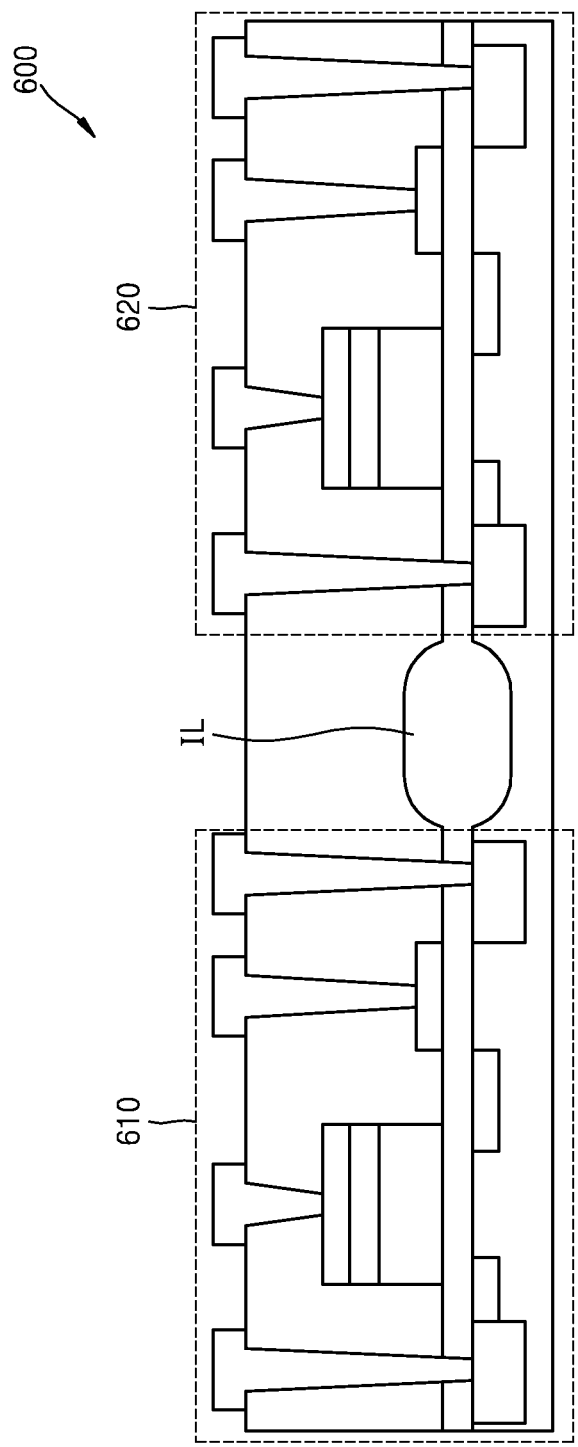
FIG. 6 is a sectional view of two synapse memory devices that are separated by an insulation layer on a substrate, according to an example embodiment.

FIG. 6 is a sectional view of two synapse memory devices 610 and 620 on a substrate, the two synapse memory devices 610 and 620 being separated by an insulation layer IL, according to an example embodiment. The insulation layer IL formed by, for example, a LOCOS process, may minimize or substantially prevent current leakage between the synapse memory devices 610 and 620.

Figure 7A:
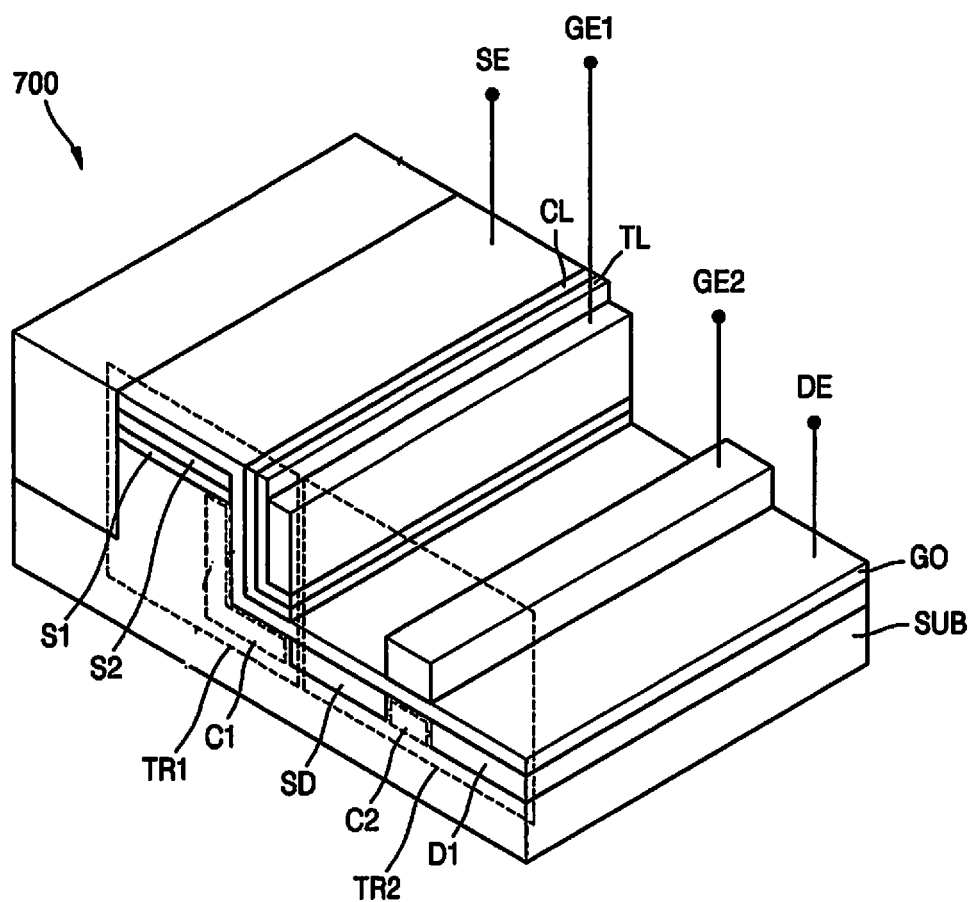
FIGS. 7A and 7B are perspective views of a synapse memory device according to another example embodiment.
Figure 7B:
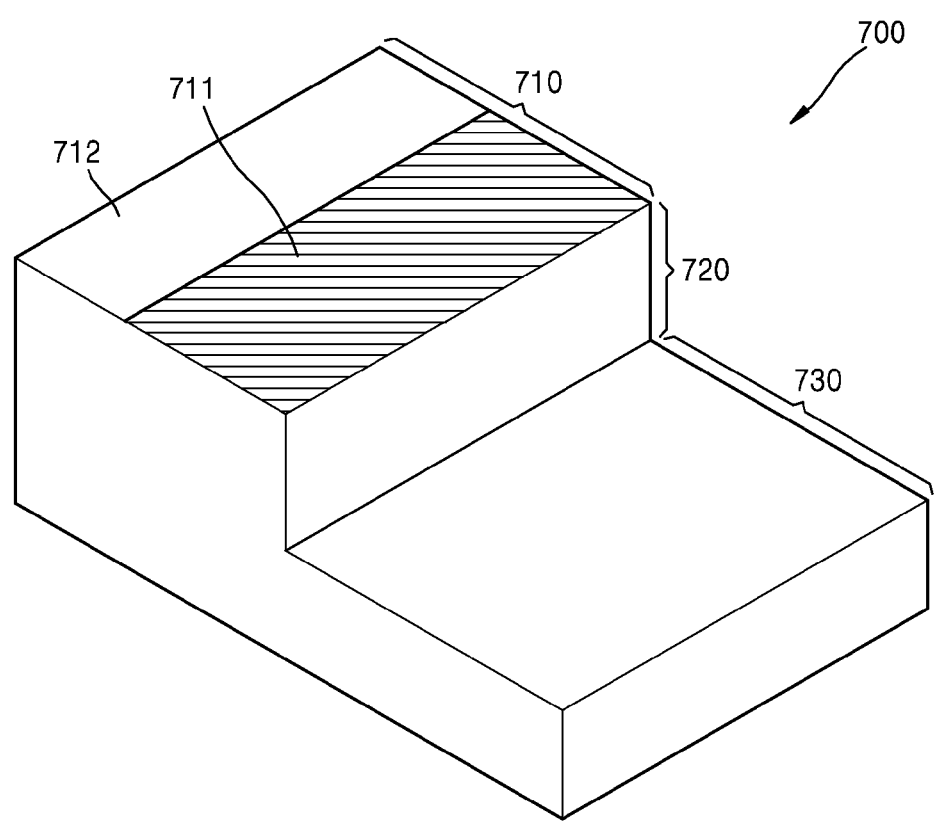

FIGS. 7A and 7B are perspective views of a synapse memory device 700, according to another example embodiment. Since the synapse memory device 700 is substantially the same as the synapse memory device 100 of FIG. 1 in terms of components and operating principle, common elements are omitted and only elements different from those of FIG. 1 will be described as below. The synapse memory device 700 according to the example embodiment is able to perform a self-alignment during processing, and thus, the positions of a first source region, a drain region, and a source-drain shared area may be precisely controlled and the process may be simplified. Furthermore, in a synapse memory device of the example embodiment, a memory layer M1 of a first transistor TR1 is vertically designed and an area of the synapse memory device is reduced, and thus, the device may be integrated.

Referring to FIG. 7A, the synapse memory device 700 according to the example embodiment includes the vertical first transistor TR1 and the substantially flat second transistor TR2 including the memory layer M1 formed on the substrate SUB. The first and second transistors TR1 and TR2 may share a source-drain shared area SD as a drain region and a first source region, respectively. In other words, the drain region of the first transistor TR1 and the first source region of the second transistor TR2 may be the source-drain shared area SD. Referring to FIG. 7B, the substrate SUB may have a stepped structure. Hereinafter, a plane corresponding to an upper portion of the stepped structure is denoted as a first plane area 710, a lateral plane corresponding to a step is denoted as a lateral surface 720, and a plane corresponding to a lower portion of the stepped structure is denoted as a second plane area 730. The lateral surface 720 may be substantially perpendicular to the first and second plane areas 710 and 730, but is not limited thereto. The first plane area 710 may include a second area 712 having an insulation layer and a first area 711 having a first source region S1 and a second source region S2. The second area 712 and the first area 711 may be spaced apart from each other.

The vertical first transistor TR1 may include the memory layer M1 and the first gate electrode GE1 formed on the lateral surface 720, the memory layer M1 and the first gate electrode GE1 corresponding to elements discussed above with respect to, for example, FIGS. 1-3. A "vertical" memory layer M1 may indicate that the memory layer M1 of the first transistor TR1 is arranged on the lateral surface 720 that is substantially perpendicular to the second plane area 730. Therefore, the memory layer M1 may be substantially perpendicular to the second plane area 730. The lateral surface 720 may be formed to be tilted relative to the form of the stepped structure of the substrate SUB. Therefore, the term "vertical" may not only indicate that the memory layer M1 is formed vertically (that is, at an angle of substantially 90 degrees) to the second plane area 730, but also indicate that the memory layer M1 is tilted relative to the second plane area 730. The stepped structure may include a structure of the first plane area 710 that is higher than the second plane area 730 by a height substantially equal to the vertical height of the lateral surface 720. A first source region of the first transistor TR1 may be formed in a recessed portion of the first area 711 of the first plane area 710 and the source-drain shared area SD corresponding to a drain region may be formed in a recessed portion of the second plane area 730. As a first channel region indicates a substrate SUB region between the source-drain shared area SD and the first source region S1, a first channel region C1 may have a vent structure when the lateral surface 720 is substantially perpendicular to the first and second plane areas 710 and 730.

The substantially flat second transistor TR2 may include a second channel region C2 located in the second plane area 730 of the substrate SUB and a second gate electrode GE2 located in the second channel region C2. The term "flat" may indicate that a transistor is provided on the second plane area 730 is substantially parallel to the substrate SUB.

The insulation layer IL may be formed in a second area 712 of the substrate SUB. The insulation layer IL may minimize or substantially prevent current leakage and may be formed through a LOCOS process or an STI process.

FIGS. 8A through 8K are perspective views illustrating a method of fabricating a synapse memory device 800, according to another example embodiment.

Figure 8A:
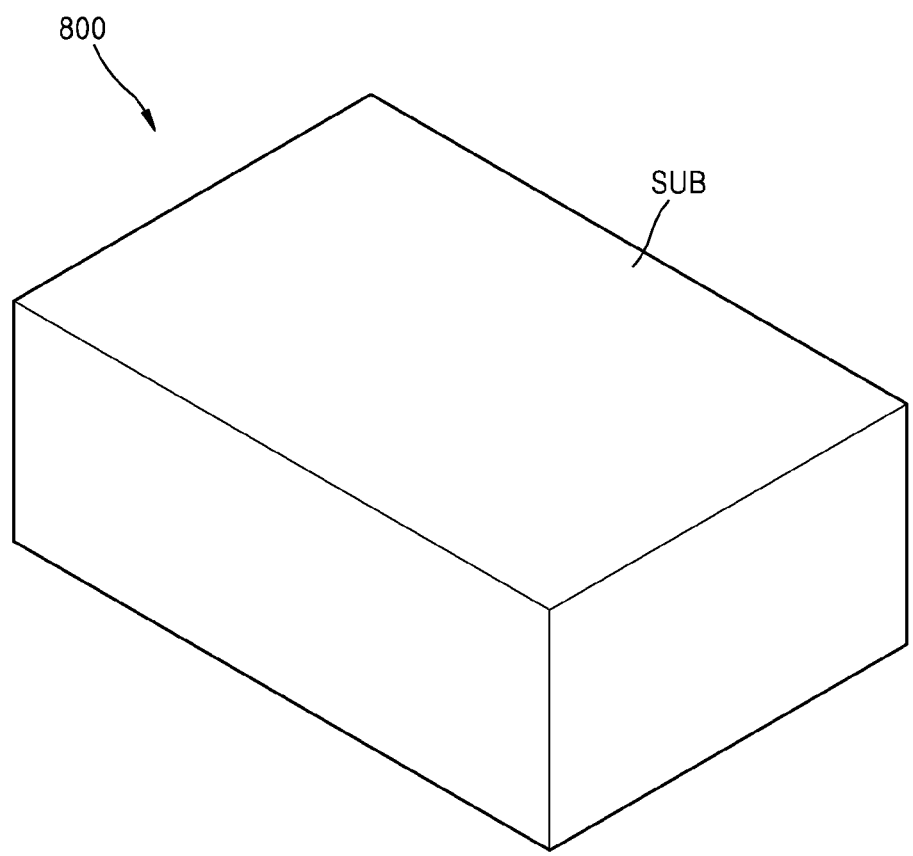
FIGS. 8A through 8K are perspective views illustrating a method of fabricating a synapse memory device, according to another example embodiment.

Referring to FIG. 8A, a substrate SUB may be provided. The substrate SUB may be or include a silicon substrate SUB.

Figure 8B:
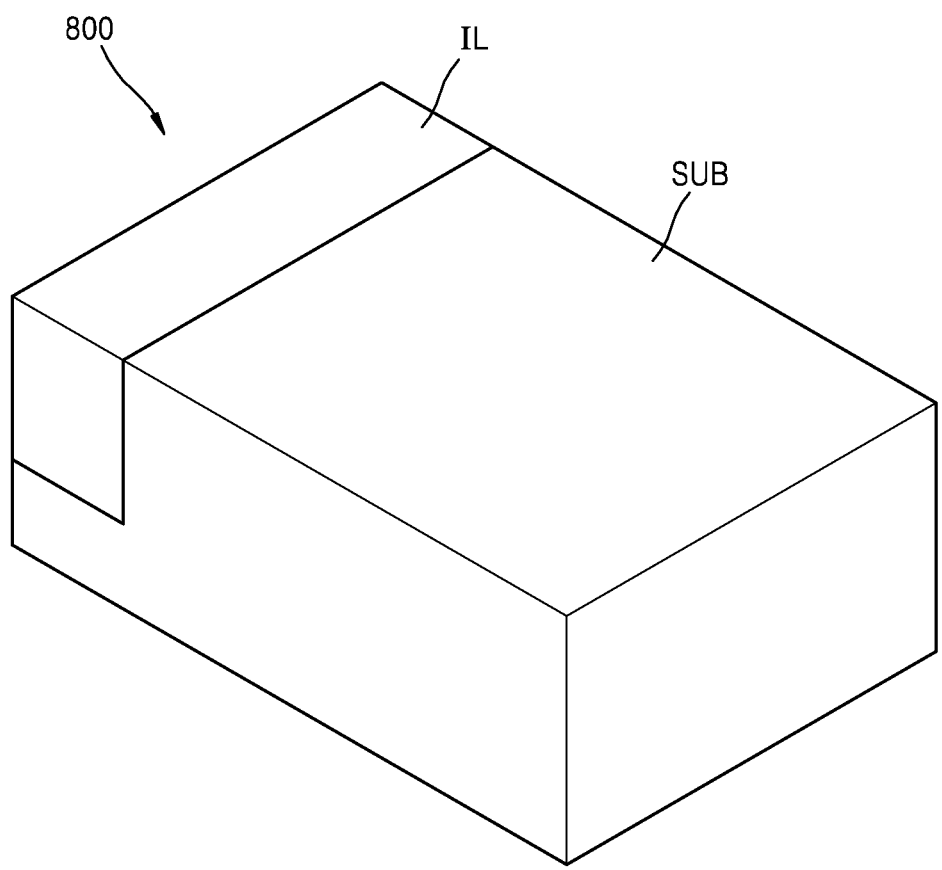

Referring to FIG. 8B, an insulation layer IL may be formed on the second region 712 (of FIG. 7) of the substrate SUB. The insulation layer IL may be formed through a LOCOS process or an STI process.

Figure 8C:
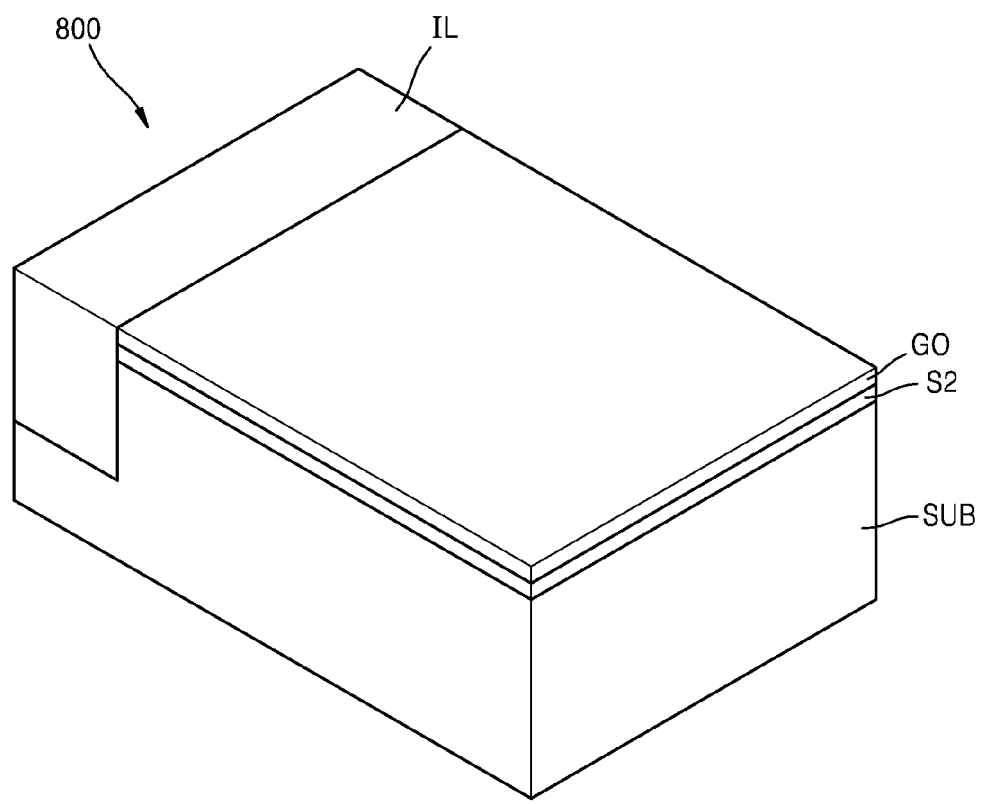

Referring to FIG. 8C, a gate oxide layer GO and a second source region S2 may be formed on the substrate SUB. The gate oxide layer GO may be formed by oxidizing an upper portion of the substrate SUB region not including the insulation layer IL. The gate oxide layer GO may be formed by, for example, a CVD method. The second source region S2 may be formed by implanting a second conductivity-type dopant in the substrate SUB. The second source region S2 may form a PN junction structure with a first source region S1 (of FIG. 8J) to be formed later. A dopant may be implanted by using the insulation layer IL as a mask when forming the second source region S2. The dopant may minimize or substantially prevent current leakage. The second source region S2 may include a dopant having a conductivity-type that is different from the conductivity type of the first source region S1 (of FIG. 8J) described below.

Figure 8D:
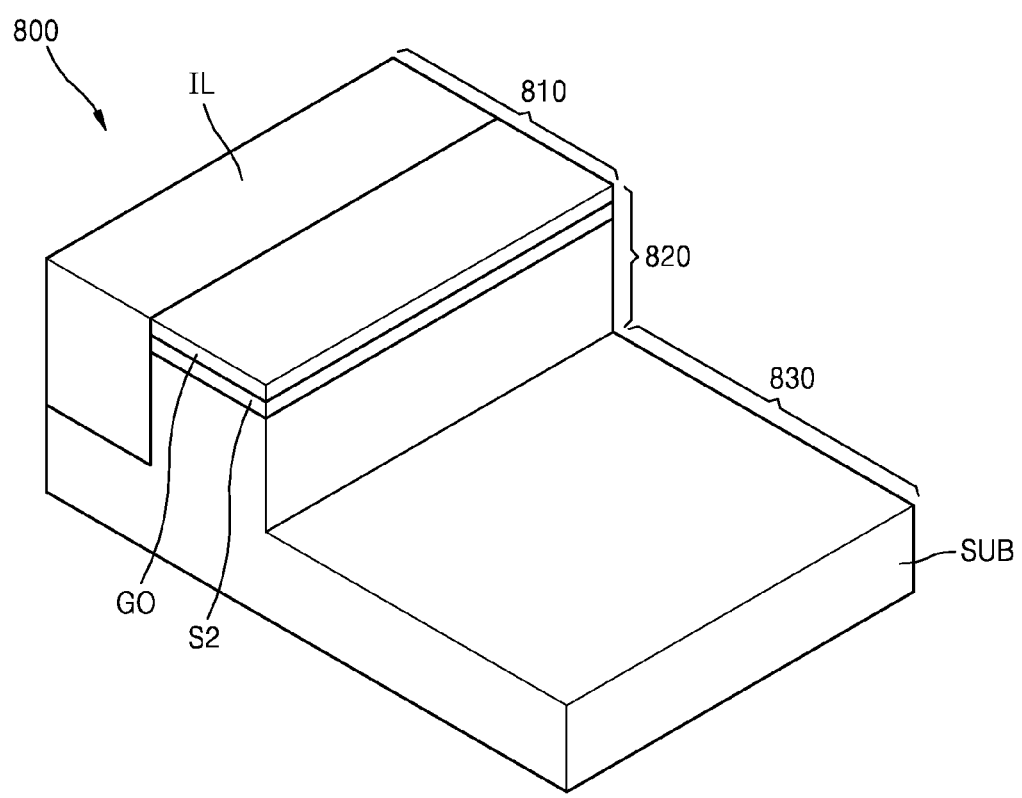

Referring to FIG. 8D, a stepped structure may be formed on the substrate SUB. The stepped structure of the substrate SUB may be formed by etching the substrate SUB by using a first plane area 810 of the substrate SUB as a mask. A lateral surface 820 and a second plane area 830 of the substrate SUB may be exposed by etching. The lateral surface 820 may be substantially perpendicular to the first and second plane areas 810 and 830. Since a memory layer M1 of a first transistor TR1 is arranged on the lateral surface 820, a volume of the memory layer M1 becomes larger as a height of the lateral surface 820 becomes higher on an assumption that a cross sectional area of the memory layer M1 on the substrate SUB is substantially the same as cross section of the memory layer M1 on the lateral surface 820. Total storable charge of the memory layer M1 may be proportional to the volume of the memory layer M1. It is possible to heighten the height of the lateral surface 820 by more deeply etching the substrate SUB in order to increase the volume of the memory layer M1.

Figure 8E:
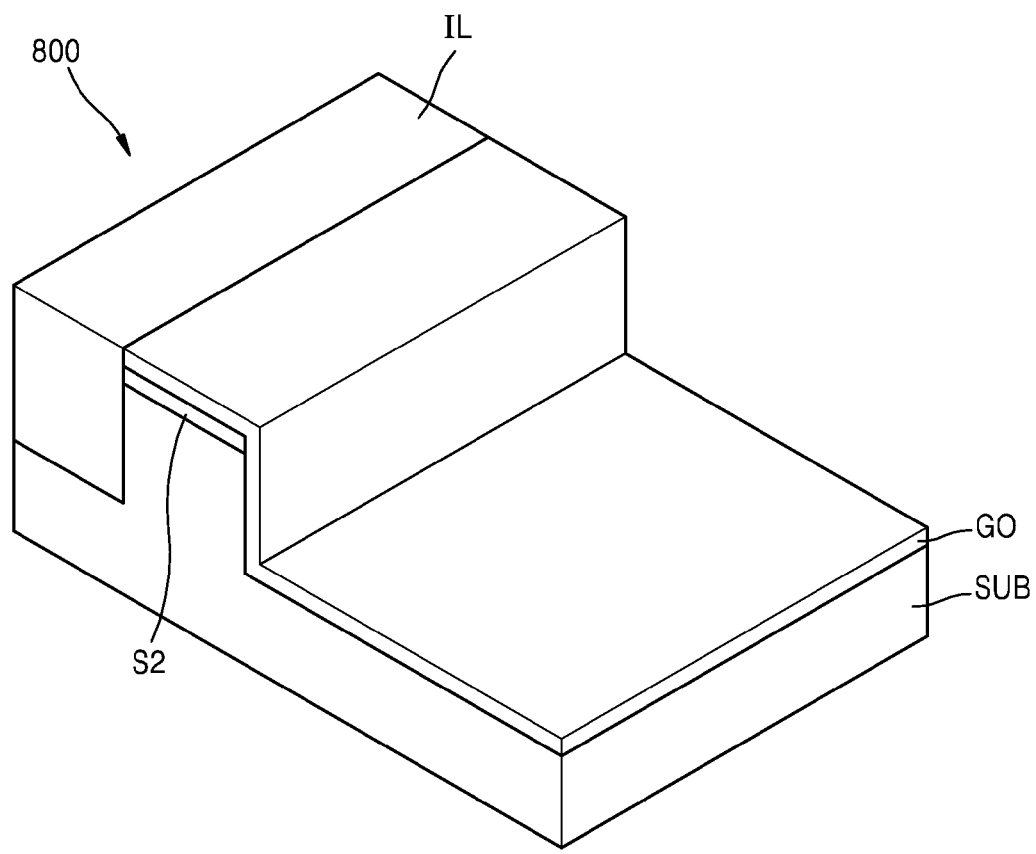

Referring to FIG. 8E, the gate oxide layer GO may be formed on the exposed lateral surface 820 and the second plane area 830. A thickness of the gate oxide layer GO may be substantially the same as the thickness of the gate oxide layer GO formed on the first region 811.

Figure 8F:
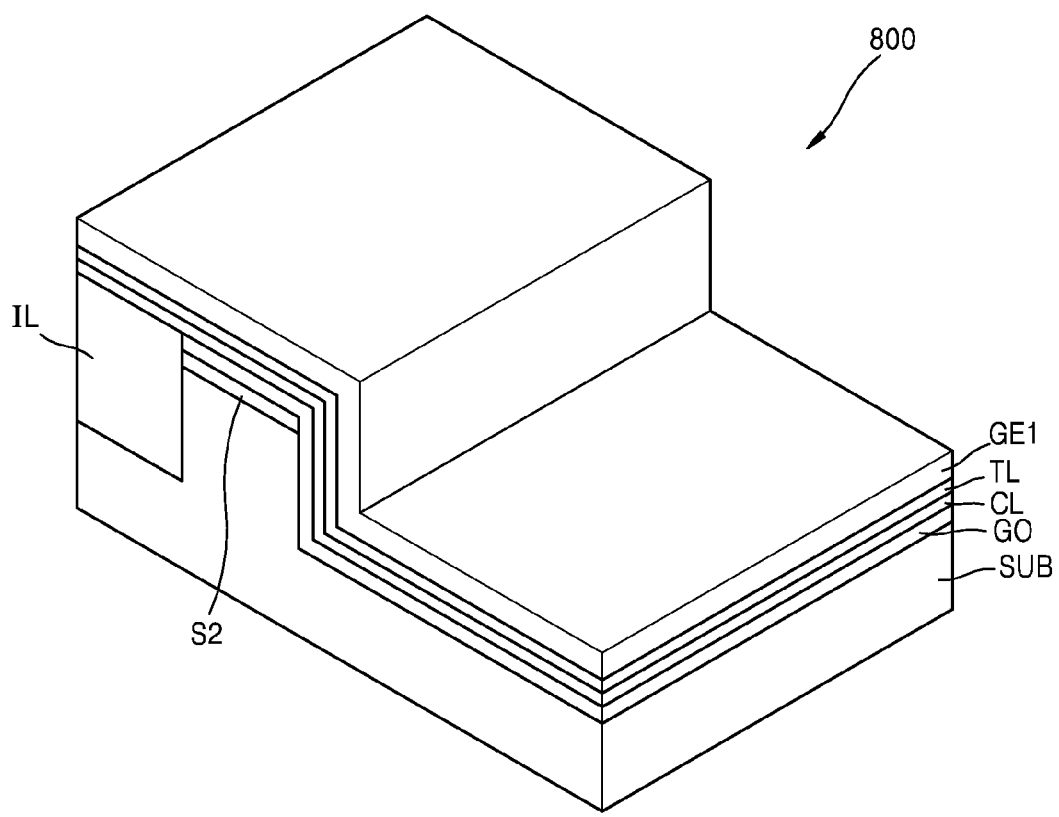

Referring to FIG. 8F, a charge trap layer CL, a threshold switching layer TL, and a first gate electrode GE1 may be formed, for example, sequentially formed on the gate oxide layer GO.

Figure 8G:
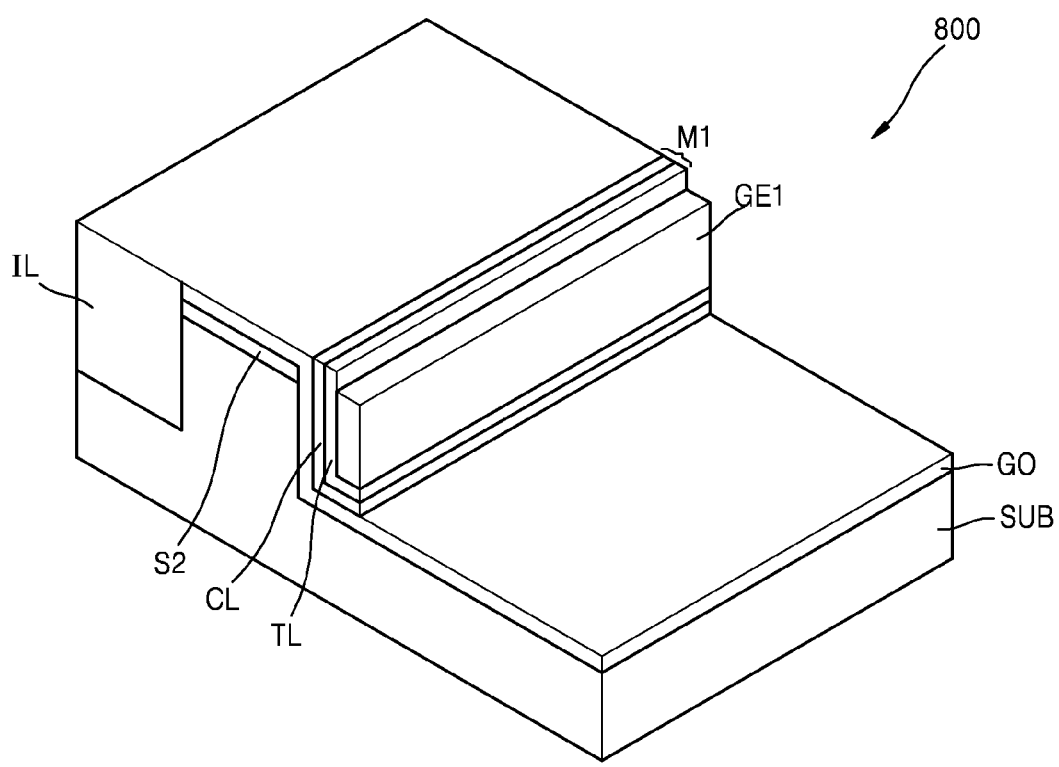

Referring to FIG. 8G, the remaining portions of the charge trap layer CL, the threshold switching layer TL, and the first gate electrode GE1, that is, the portions that are not disposed on the lateral surface 820, may be removed.

Figure 8H:
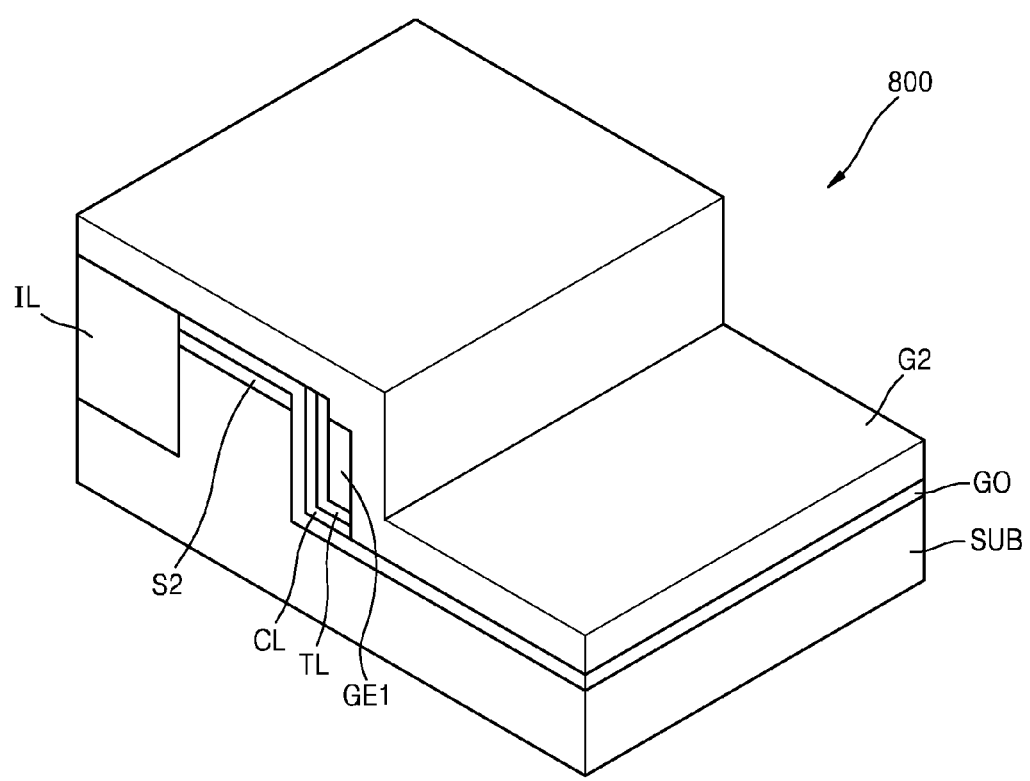

Referring to FIG. 8H, the second gate electrode GE2 may be formed on the substrate SUB.

Figure 8I:
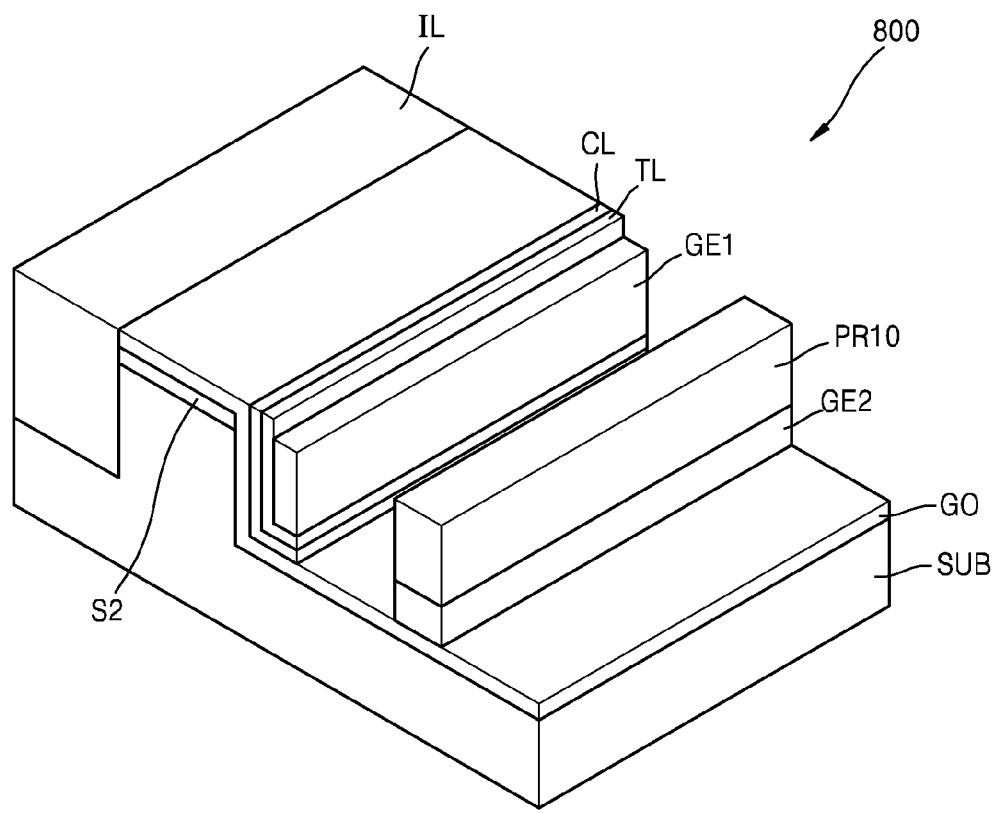

Referring to FIG. 8I, the second gate electrode GE2 may be disposed on a second channel region C2 of the second plane area 830. The remaining portion of the second gate electrode GE2 may be removed by using a tenth photoresist pattern PR10 as a mask.

Figure 8J:
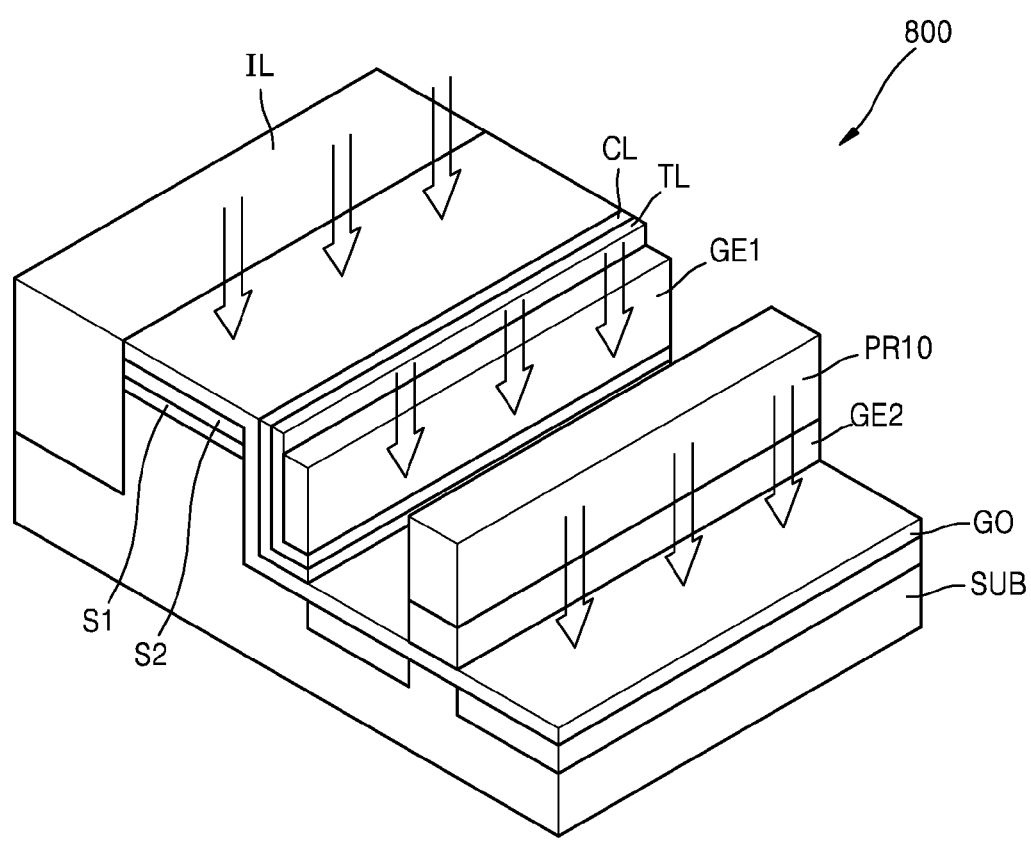

Referring to FIG. 8J, the first source region S1, the source-drain shared area SD, and the drain region D1 may be formed by implanting a dopant having a first conductivity-type on the substrate SUB. The dopant may be implanted via ion implantation method. An acceleration voltage may be appropriately selected so that the dopant may penetrate through the gate oxide layer GO and the second source region S2 and may be implanted in the substrate SUB. The first source region S1 may be located below the second source region S2 and may form a PN junction. The method of fabricating the synapse memory device illustrated in FIGS. 5A through 5L forms a first source region, a source-drain shared area, and a drain region, and continuously advances a gate forming process. However, a mask forming process is further needed to form the first source region, the source-drain shared area, and the drain region. Meanwhile, the method of fabricating the synapse memory device according to the example embodiment advances the gate forming process first and continuously forms the first source region S1, the source-drain shared area SD, and the drain region D1. Therefore, the first source region S1, the source-drain shared area SD, and the drain region D1 may be formed by using the first and second gate electrodes GE1 and GE2 as a mask without a separate mask forming process. The process may be simplified by omitting the separate mask forming process. Furthermore, the first source region S1, the source-drain shared area SD, and the drain region D1 may be self-aligned by implanting an ion in an exposed region by using the first and second gate electrodes GE1 and GE2 as a mask. By the self-alignment, positions of the through first source region S1, the source-drain shared area SD, and the drain region D1 may be precisely controlled. It is possible to minimize current leakage by minimizing ion diffusion of the first source region S1, the source-drain shared area SD, and the drain region D1.

Figure 8K:
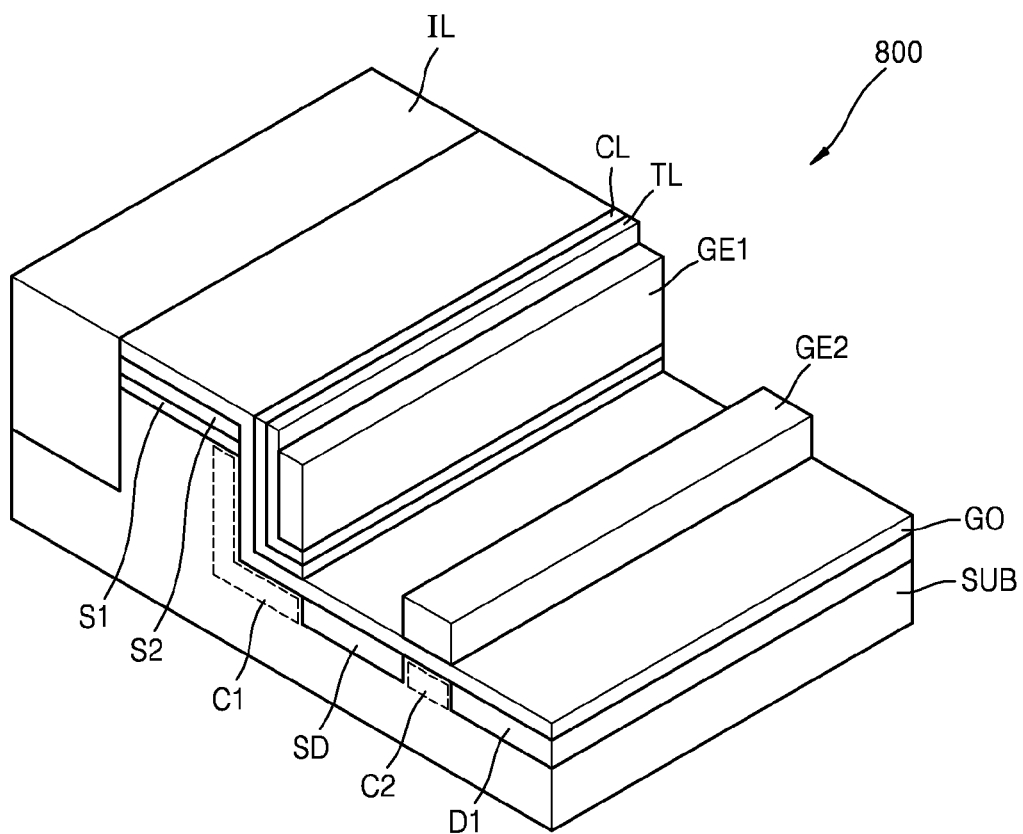

Referring to FIG. 8K, a synapse memory device may be fabricated by removing the tenth photoresist pattern PR10. The synapse memory device 800 according to the example embodiment may be or include a four-terminal synapse memory device which is operated by a source electrode SE (not shown) electrically connected to a second source region S2, first and second gate electrodes GE1 and GE2, and a drain electrode DE (not shown) electrically connected to a drain region D1.

Figure 9:
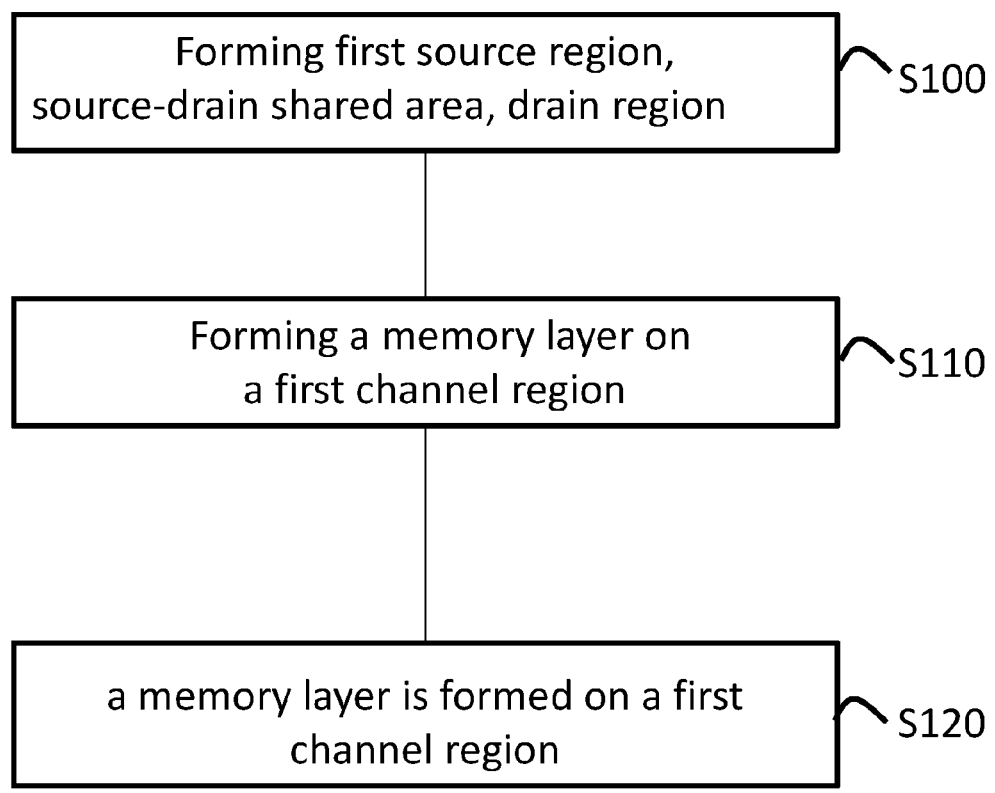
FIGS. 9-11 are flow charts illustrating method of fabricating a synapse memory device, according to various example embodiments.
Figure 10:
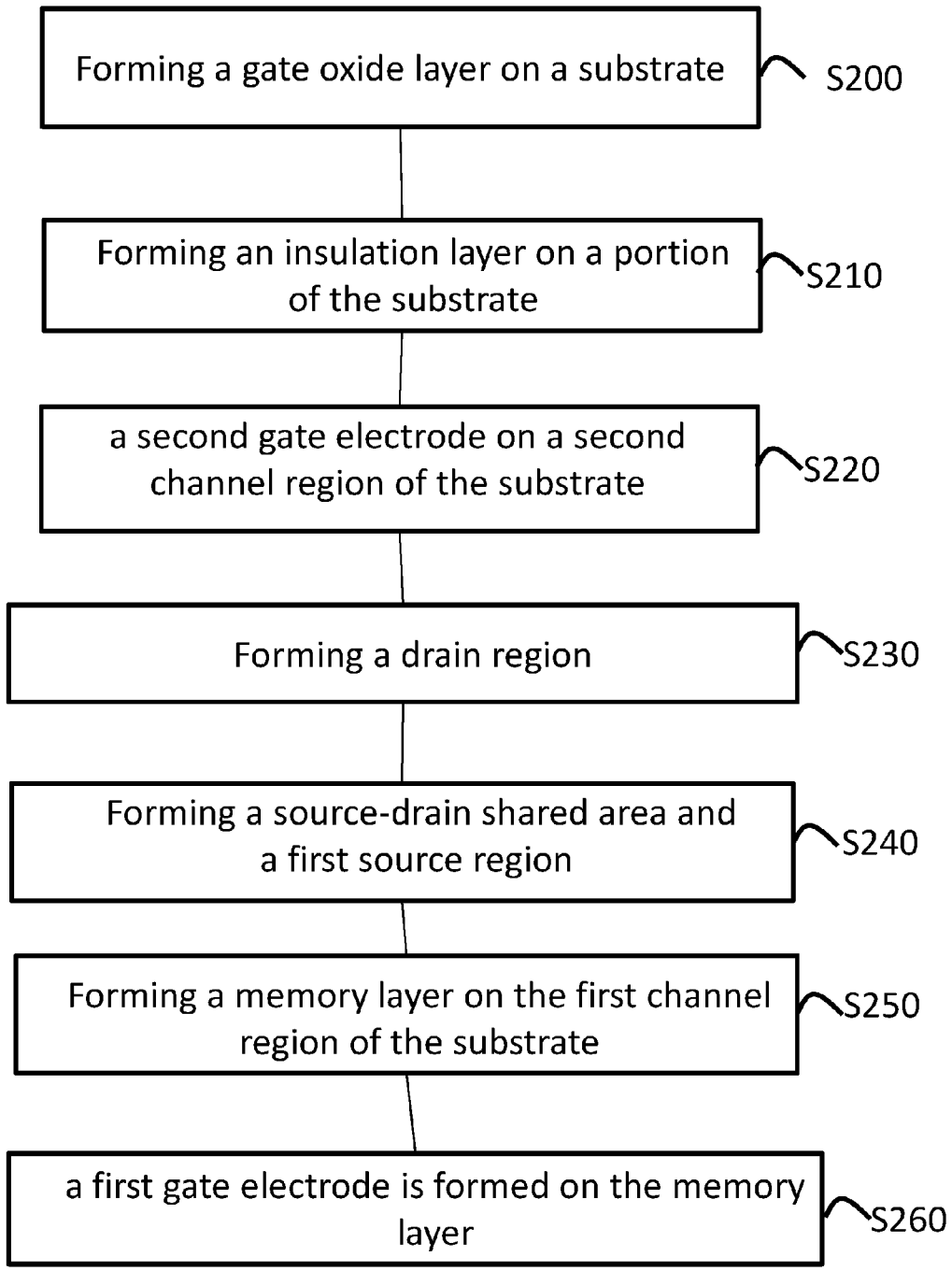
Figure 11:
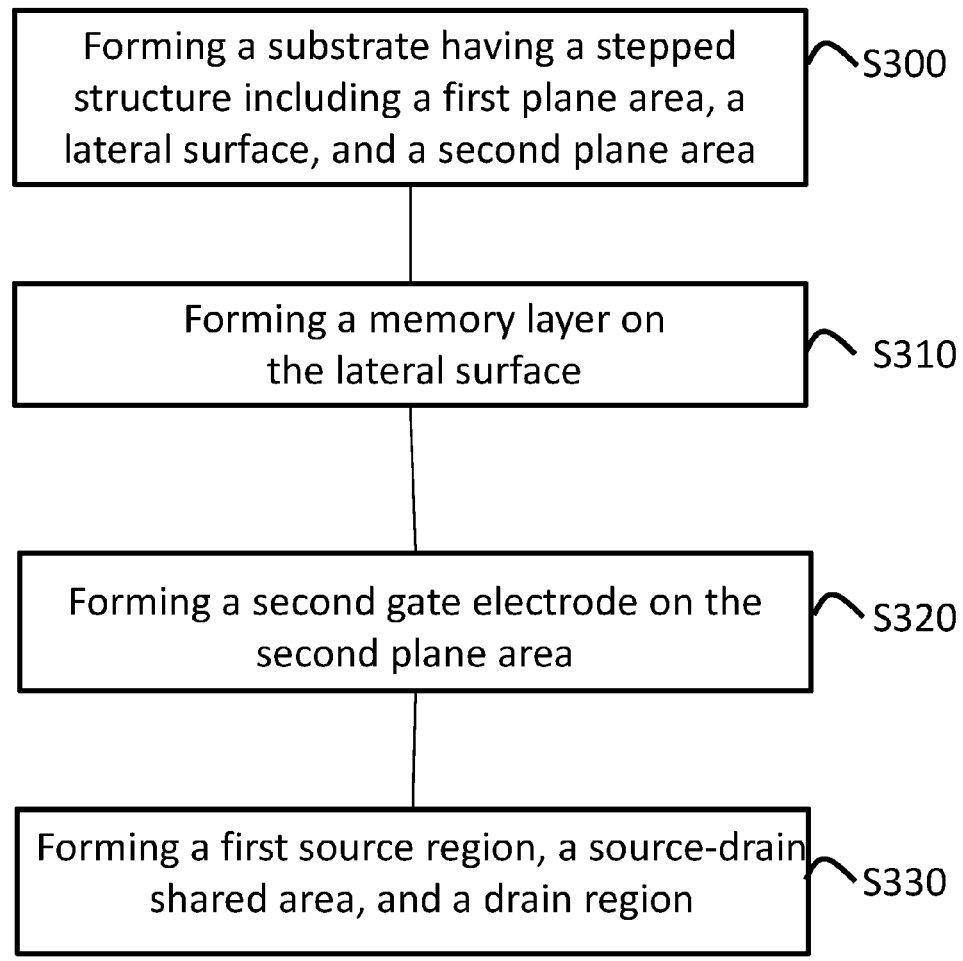

FIGS. 9-11 are flow charts illustrating method of fabricating a synapse memory device, according to various example embodiments. In FIG. 9, the method starts at S100, where a first source region, a source-drain shared area, and a drain region are formed by implanting a first conductivity-type dopant in a plurality of regions of a substrate, the plurality of regions being spaced apart from each other. In S110, a memory layer is formed on a first channel region between the first source region and the source-drain shared area. In S120, a second gate electrode is formed on a second channel region between the drain region and the source-drain shared area. In S130, a first gate electrode is formed on the memory layer.

In FIG. 10, the method starts at S200, where a gate oxide layer is formed on a substrate. In S210, an insulation layer is formed on a portion of the substrate. In S220, a second gate electrode is formed on a second channel region of the substrate. In S230, a drain region is formed, the drain region contacting a side of the second channel region. In S240, a source-drain shared area and a first source region are formed, the source-drain shared area contacting another side of the second channel region and a side of a first channel region, and the first source region contacting another side of the first channel region. In S250, a memory layer is formed on the first channel region of the substrate. In S260, a first gate electrode is formed on the memory layer.

In FIG. 11, the method starts at S300, where a substrate having a stepped structure including a first plane area, a lateral surface, and a second plane area is formed. In S310, a memory layer is formed on the lateral surface. In S320, a first gate electrode is formed on the memory layer. In S330, a second gate electrode is formed on the second plane area. In S340, a first source region, a source-drain shared area, and a drain region are formed by implanting a dopant in regions of the substrate defined by a mask formed from the first and second gate electrodes.

The disclosed example embodiments may realize a synapse memory device which has multi-level characteristics and that is capable of being operated at a low voltage. Furthermore, the disclosed example embodiments may realize a synapse memory device having a large number of levels at a small size while capable of operating in a low voltage region.

It should be understood that the example embodiments described herein should be considered in a descriptive sense only and not for purposes of limitation. Descriptions of the features within each example embodiment should typically be considered as available for other same or similar features in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. A method of fabricating a synapse memory device, the method comprising:
    forming a first source region, a source-drain shared area, and a drain region by implanting a first conductivity-type dopant in a plurality of regions of a substrate, the plurality of regions being spaced apart from each other;
    forming a memory layer on a first channel region between the first source region and the source-drain shared area;
    forming a second gate electrode on a second channel region between the drain region and the source-drain shared area;
    forming a second source region by implanting a second conductivity-type dopant in a region of the substrate that contacts the first source region and that is spaced apart from the first channel region, wherein the second conductivity-type dopant is different from the first conductivity-type dopant, and the first and second source regions form a PN junction structure;
    forming a source electrode in electrical contact with the second source region and that has no contact with the first source region; and
    forming a first gate electrode on the memory layer.

2. The method of claim 1, wherein the forming of the first source region, the source-drain shared area, and the drain region comprises:
    contemporaneously forming the first source region and the source-drain shared area, and
    forming the drain region in an operation different from the forming of the first source region and the source-drain shared area.

3. The method of claim 2, wherein
    a depth profile of the first source region is substantially the same as a depth profile of the source-drain shared area, and
    a depth profile of the drain region is deeper than the depth profile of the first source region.

4. The method of claim 1, wherein a depth profile of the second source region is deeper than depth profiles of the first source region and of the source-drain shared area.

5. The method of claim 1, wherein the depth profile of the second source region is substantially the same as the depth profile of the drain region.

6. The method of claim 1, wherein the memory layer comprises a charge trap layer formed on the first channel region and a threshold switching layer formed on the charge trap layer.

7. The method of claim 6, wherein the charge trap layer comprises $Si_3N_4$.

8. The method of claim 6, wherein the threshold switching layer comprises at least one of NiO, TaO and $TiO_2$.

9. A method of fabricating a synapse memory device, the method comprising:
    forming a gate oxide layer on a substrate;
    forming an insulation layer on a portion of the substrate;
    forming a second gate electrode on a second channel region of the substrate;
    forming a drain region, the drain region contacting a side of the second channel region;
    forming a source-drain shared area and a first source region, the source-drain shared area contacting another side of the second channel region and a side of a first channel region, and the first source region contacting another side of the first channel region;
    forming a memory layer on the first channel region of the substrate;
    forming a second source region by implanting a second conductivity-type dopant in a region of the substrate that contacts the first source region and that is spaced apart from the first channel region, wherein the second conductivity-type dopant is different from the first conductivity-type dopant, and the first and second source regions form a PN junction structure;
    forming a source electrode in electrical contact with the second source region and that has no contact with the first source region; and
    forming a first gate electrode on the memory layer.

10. The method of claim 9, wherein the insulation layer is formed by a local oxidation of silicon (LOCOS) process.

11. The method of claim 9, wherein the memory layer comprises a charge trap layer formed on the first channel region and a threshold switching layer formed on the charge trap layer.

12. The method of claim 11, wherein the charge trap layer comprises $Si_3N_4$.

13. The method of claim 11, wherein the threshold switching layer comprises at least one of NiO, TaO, $TiO_2$.

14. A method of fabricating a synapse memory device, the method comprising:
    providing a substrate having a stepped structure including a first plane area, a lateral surface, and a second plane area;
    forming a memory layer on the lateral surface;
    forming a first gate electrode on the memory layer;
    forming a second gate electrode on the second plane area; and
    forming a first source region, a source-drain shared area, and a drain region, wherein the forming includes implanting a dopant in regions of the substrate defined by a mask formed from the first and second gate electrodes, wherein
    the first plane area is higher than the second plane area by a height equal to a vertical height of the lateral surface.

15. The method of claim 14, wherein the providing of the substrate having the stepped structure comprises:
    forming the lateral surface and the second plane area by etching the substrate by using the first plane area as a mask.

16. The method of claim 14, the method of fabricating the synapse memory device further comprising:
    forming an insulation layer on the first plane area by using a local oxidation of silicon (LOCOS) process or a shallow-trench-isolation (STI) process.

* * * * *